(12) United States Patent
Reeves

(10) Patent No.: US 8,676,550 B1
(45) Date of Patent: Mar. 18, 2014

(54) MODELING OF PASSIVE MULTIPLEXERS FOR SIGNAL FILTERS

(75) Inventor: Timothy Reeves, Seabrook, NH (US)

(73) Assignee: The MathWorks, Inc., Natick, MA (US)

( * ) Notice: Subject to any disclaimer, the term of this patent is extended or adjusted under 35 U.S.C. 154(b) by 647 days.

(21) Appl. No.: 12/896,064

(22) Filed: Oct. 1, 2010

(51) Int. Cl.
*G06F 17/50* (2006.01)

(52) U.S. Cl.
USPC ......... 703/2; 703/5; 703/13; 703/22; 324/670

(58) Field of Classification Search
USPC .............................. 703/2, 13, 5, 22; 324/670
See application file for complete search history.

(56) References Cited

U.S. PATENT DOCUMENTS

| | | | | |
|---|---|---|---|---|
| 4,181,881 | A | * | 1/1980 | Preikschat ................... 324/670 |
| 4,258,435 | A | * | 3/1981 | Levy et al. ................... 370/497 |
| 4,584,512 | A | * | 4/1986 | Pritchard ...................... 318/696 |

OTHER PUBLICATIONS

Cameron, Richard J., "Advanced Coupling Martix Synthesis Techniques for Microwave Filters," IEEE Transactions on Microwave Theory and Techniques, vol. 51, No. 1, IEEE, Jan. 2003, pp. 1-10.
Cameron, Richard J., "General Coupling Matrix Synthesis Methods for Chebyshev Filtering Functions," IEEE Transactions on Microwave Theory and Techniques, vol. 47, No. 4, IEEE, Apr. 1999, pp. 433-442.
Cameron, Richard J., et al. "Microwave Filters for Communication Systems: Fundamentals, Design, and Applications," Wiley, Jul. 2007, pp. 244-247, 268, 281, and 373-375.
Pozar, David M., "Microwave Engineering," Wiley: John Wiley & Sons, Inc., Third Edition, 2005, pp. 170-174.

\* cited by examiner

*Primary Examiner* — Thai Phan
(74) *Attorney, Agent, or Firm* — Cesari and McKenna, LLP; Michael R. Reinemann

(57) ABSTRACT

A system and method are described that model a passive multiplexer, which may be used for a junction of a plurality of signal filters (e.g., radio frequency, microwave, satellite, etc.). Illustratively, based on obtaining parameters for the individual signal filters, an initial resonant frequency offset vector estimation may be calculated and input into a convergence algorithm to determine a set of multiplexer parameters. In particular, the convergence algorithm is generally different from the initial resonant frequency offset vector estimation calculation, and the initial resonant frequency offset vector estimation assists in achieving better (e.g., faster, more frequent) convergence on a set of multiplexer parameters from the convergence algorithm.

44 Claims, 24 Drawing Sheets

$$[Z_{in}^{Tx}] = \begin{cases} Z_0 & f=f_{T1} \\ j0 & f=f_{T1} \\ Z_0 & f=f_{T2} \\ j0 & f=f_{T2} \\ Z_0 & f=f_{T3} \\ j0 & f=f_{T3} \end{cases} \quad [Z_{in}^{Rx}] = \begin{cases} Z_0 & f=f_{R1} \\ j0 & f=f_{R1} \\ Z_0 & f=f_{R2} \\ j0 & f=f_{R2} \\ Z_0 & f=f_{R3} \\ j0 & f=f_{R3} \end{cases} = [Z_{in}^{nom}(\overline{x})]_{12 \times 1}$$

$$[Z_{in}^{nom}(\overline{x})]_{n \times 1} = [Z_{in}(\overline{x}_0)]_{n \times 1} + \left[\frac{\partial Z_{in}(\overline{x}_0)}{\partial \overline{x}}\right]_{n \times n} [\Delta \overline{x}]_{n \times 1}$$

$$[\Delta Z_{in}]_{n \times 1} = [Z_{in}^{nom}(\overline{x})]_{n \times 1} - [Z_{in}(\overline{x}_0)]_{n \times 1}$$

$$[\Delta(\overline{x})]_{n \times 1} = \left[\frac{\partial Z_{in}(\overline{x}_0)}{\partial \overline{x}}\right]_{n \times n}^{-1} [\Delta Z_{in}(\overline{x})]_{n \times 1}$$

$$[y^{TX}] = \begin{bmatrix} R & jM_{01} & 0 & 0 \\ jM_{01} & sC_1 & jM_{12} & 0 \\ 0 & jM_{12} & sC_2 & jM_{23} \\ 0 & 0 & jM_{23} & sC_3+G \end{bmatrix}$$

$$[y^{RX}] = \begin{bmatrix} R & jM_{04} & 0 & 0 \\ jM_{04} & sC_4 & jM_{45} & 0 \\ 0 & jM_{45} & sC_5 & jM_{56} \\ 0 & 0 & jM_{56} & sC_6+G \end{bmatrix}$$

$$[y^{TX}]' = \begin{bmatrix} sC_1 & jM_{12} & 0 \\ jM_{12} & sC_2 & jM_{23} \\ 0 & jM_{23} & sC_3+G \end{bmatrix}$$

$$[y^{RX}]' = \begin{bmatrix} sC_4 & jM_{45} & 0 \\ jM_{45} & sC_5 & jM_{56} \\ 0 & jM_{56} & sC_6+G \end{bmatrix}$$

$$[Y^{MUX}]_{7\times 7} = \begin{bmatrix} R & jM_{01} & 0 & 0 & jM_{04} & 0 & 0 \\ jM_{01} & & & & & & \\ 0 & & [Y^{TX}]^l_{3\times 3} & & & [\emptyset]_{3\times 3} & \\ 0 & & & & & & \\ jM_{04} & & & & & & \\ 0 & & [\emptyset]_{3\times 3} & & & [Y^{RX}]^l_{3\times 3} & \\ 0 & & & & & & \end{bmatrix}$$

$$Z_{11}(s) = \frac{adj[Y_{11}(s)]}{\det[Y_{11}(s)]}$$

$$Z_{in}(s) = Z_0 \left( \frac{1 - S_{11}(s)}{1 + S_{11}(s)} \right)$$

$$Y_{nn}(s) = sC_n \rightarrow sC_n + jB_n \quad \text{(for n>1)}$$

$$[Y] = \begin{bmatrix} G & jM_{01} & jM_{04} \\ jM_{01} & sC_1 - jB_1 + G & 0 \\ jM_{04} & 0 & sC_4 + jB_1 + G \end{bmatrix}$$

$$[Y]_{3\times 3} = \begin{bmatrix} r & jM_{01} & jM_{04} \\ jM_{01} & j(C_1 b)(\omega - \omega_1) - jB_1 + r & 0 \\ jM_{04} & 0 & j(C_1 b)(\omega + \omega_1) + jB_1 + r \end{bmatrix}$$

$$[Y]_{3\times 3} = \begin{bmatrix} 1 & j & j \\ j & j(C_1 b)(\omega - \omega_1) - jB_1 + 1 & 0 \\ j & 0 & j(C_1 b)(\omega + \omega_1) + jB_1 + 1 \end{bmatrix}$$

$$[Z]_{3\times3} = inv[Y]_{3\times3} = \begin{bmatrix} Z1 & Z2 & Z3 \\ Z4 & Z5 & Z6 \\ Z7 & Z8 & Z9 \end{bmatrix}$$

(Eq. 25)

WHERE:

$$Z1 = \frac{B_1^2 + 2(B_1)(C_1b)(\omega_1) - (C_1b)^2(\omega)^2 + (C_1b)^2(\omega_1)^2 + 2j(B_1)(C_1b)(\omega) + 1}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z2, Z4 = \frac{-(B_1 + (C_1b)(\omega) + (C_1b)(\omega_1) - j)}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z3 = \frac{B_1 + (C_1b)(\omega) + (C_1b)(\omega_1) - j}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z5 = \frac{j(C_1b)(\omega) + 2 + j(C_1b)(\omega_1) + j(B_1)}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z6, Z8 = \frac{-1}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z7 = \frac{B_1 - (C_1b)(\omega) + (C_1b)(\omega_1) + j}{B_1^2 + 2(B_1)(C_1b)(\omega_1) - (C_1b)^2(\omega)^2 + (C_1b)^2(\omega_1)^2 + 4j(C_1b)(\omega) + 3}$$

$$Z9 = \frac{-(j(C_1b)(\omega) - 2 + j(C_1b)(\omega_1) + j(B_1))}{B_1^2 + 2(B_1)(C_1b)(\omega_1) - (C_1b)^2(\omega)^2 + (C_1b)^2(\omega_1)^2 + 4j(C_1b)(\omega) + 3}$$

FIG. 26

$$num = B_1^2 + 2(B_1)(C_1b)(\omega_1) - (C_1b)^2(\omega)^2 + (C_1b)^2(\omega_1)^2 + 2j(B_1)(C_1b)(\omega) + 1$$

(Eq. 26a)

$$den = B_1^2 + 2(B_1)(C_1b)(\omega_1) - (C_1b)^2(\omega)^2 + (C_1b)^2(\omega_1)^2 + 4j(C_1b)(\omega) + 3$$

(Eq. 26b)

$$den - 2(num) = -B_1^2 - 2(B_1)(C_1b)(\omega_1) + (C_1b)^2(\omega)^2 - (C_1b)^2(\omega_1)^2 + 1$$

$$\frac{\partial Z_{in}}{\partial x_j}\bigg|ij\bigg|_{f=(f_z)_i} = \frac{Z_{in}(x_1,x_2,x_3,\ldots,x_{j-1}+\Delta x_{j-1},\ldots,x_j)\big|_{f=(f_z)_i} - Z_{in}(x_1,x_2,x_3,\ldots,x_{j-1},\ldots,x_j)\big|_{f=(f_z)_i}}{\Delta x_{j-1}}$$

$$(S_{11})_{equi} = \sqrt[4]{S_{11}^{I} S_{11}^{II} S_{11}^{III} S_{11}^{IV}}$$

$$\frac{S_{11}^{I}}{(S_{11})_{equi}} = \frac{(f_{Z2_{old}} - f_{Z1})^2}{(f_{Z2_{new}} - f_{Z1})^2} \rightarrow (f_{Z2_{new}} - f_{Z1})^2 = \frac{S_{11}^{I}}{(S_{11})_{equi}} (f_{Z2_{old}} - f_{Z1})^2$$

$$f_{Z2_{new}} = f_{Z1} + \sqrt{\frac{S_{11}^{I}}{(S_{11})_{equi}}} (f_{Z2_{old}} - f_{Z1})$$

MODELING OF PASSIVE MULTIPLEXERS FOR SIGNAL FILTERS

BACKGROUND OF THE INVENTION

Signal communication, such as wireless communication (e.g., radio frequency (RF), microwave, and satellite communication), generally utilizes well known signal filters for transmitting or receiving specific signal frequencies. A known problem is created once two or more filters are connected at a "common junction", which is a last component before a shared antenna where simultaneous transmit and/or receive communications (e.g., multichannel communications) are to be performed. These complications arise from the receive and transmit filters affecting each other, altering their performance characteristics from those originally intended. This effect needs to be nullified to maintain separate channels/spectral purity (no leakage) to prevent overlap caused by one communication being stronger than another (e.g., a strong transmission overpowering a weak received signal). Additionally, if this affect is not nullified, damage can be done to various components in the transmit chain.

Passive multiplexers for signal filters may be designed such that components of filters are reconfigured to return to the characteristics desired when each original prototype filter was designed. That is, the effect above to be nullified by a passive multiplexer (e.g., a duplexer) allows for efficient signal transmission in both the transmit and receive modes of operation. Conventionally, modeling of filter multiplexers has been an ongoing challenge in the state of the art for RF/microwave filter researchers and manufacturers, with each using their own "in-house" special techniques. For example, to model a passive multiplexer, experts in the field (e.g., hardware filter manufacturers) have used labor-intensive and time-consuming physical testing (e.g., trial-and-error prototyping bench work), or inflexible and complex algorithms, typically with slow convergence or no convergence (i.e., not achieving a solution to nullify the effects of the common junction).

SUMMARY OF THE INVENTION

According to one or more embodiments of the invention, a passive multiplexer, which may be realized by connecting one port at a common junction of a plurality of signal filters (e.g., radio frequency (RF), microwave, satellite, etc.), may be modeled. Illustratively, based on obtaining parameters for the individual signal filters, an initial resonant frequency offset vector estimation may be calculated and input into a convergence algorithm to determine a set of multiplexer parameters. In particular, the convergence algorithm is generally different from the initial resonant frequency offset vector estimation calculation, and the initial resonant frequency offset vector estimation assists in achieving better (e.g., faster, more frequent) convergence on a set of multiplexer parameters from the convergence algorithm.

In one embodiment, the calculation of the initial resonant frequency offset vector estimation may be performed through iterative reduction for iterative combinations of resonant circuits connected at the common junction and appropriately terminated, for instance, based on the filter parameters of the iterative combinations. In addition, the calculation may be specifically performed at a normalized frequency offset for the iterative combinations. The initial resonant frequency offset vector estimation may then be provided to a convergence algorithm configured to determine a set of multiplexer parameters, illustratively where the convergence algorithm is different from the initial resonant frequency offset vector estimation calculation.

Also, in one embodiment, an illustrative convergence algorithm may comprise calculating an initial match frequency vector based on the filter parameters, e.g., such that the input reflection coefficient vector substantially equals zero. Further, an initial input impedance vector may then be calculated from the initial match frequency vector based on the initial resonant frequency offset vector estimation and the filter parameters. Iteratively, an updated input impedance vector may be recalculated for an updated match frequency vector, where the updated match frequency vector is based on updated resonant frequency offset vectors, and the updated resonant frequency offsets are based on a difference between a present input impedance vector and an ideal input impedance vector where the input reflection coefficient vector for the multiplexer substantially equals zero. As such, the convergence algorithm may converge on a set of multiplexer parameters using the recalculating.

Advantageously, the novel techniques described herein may be used to model passive multiplexers for any number of filters, particularly providing better (e.g., faster, more frequent/reliable) convergence, and alleviates the need for labor-intensive bench work. Illustratively, the embodiments herein may be used to calculate circuit components as well as frequency domain responses for multiplexed filters, common in RF and microwave communication systems. For instance, the novel techniques calculate frequency offsets of "input resonators," and use only a few frequency points to achieve the desired result. That is, the techniques have the ability to go from lowpass prototypes of each of the multiplexer's respective filters to a multiplexer design that is flexible enough to handle arbitrary filter bandwidths, number of filters, filter orders, and filter responses.

BRIEF DESCRIPTION OF THE DRAWINGS

The invention description below refers to the accompanying drawings, of which:

FIGS. 9-21, 23-28, and 30-32 are equations that may be used in accordance with one or more embodiments of the invention;

DETAILED DESCRIPTION OF AN ILLUSTRATIVE EMBODIMENT

Figure 1:
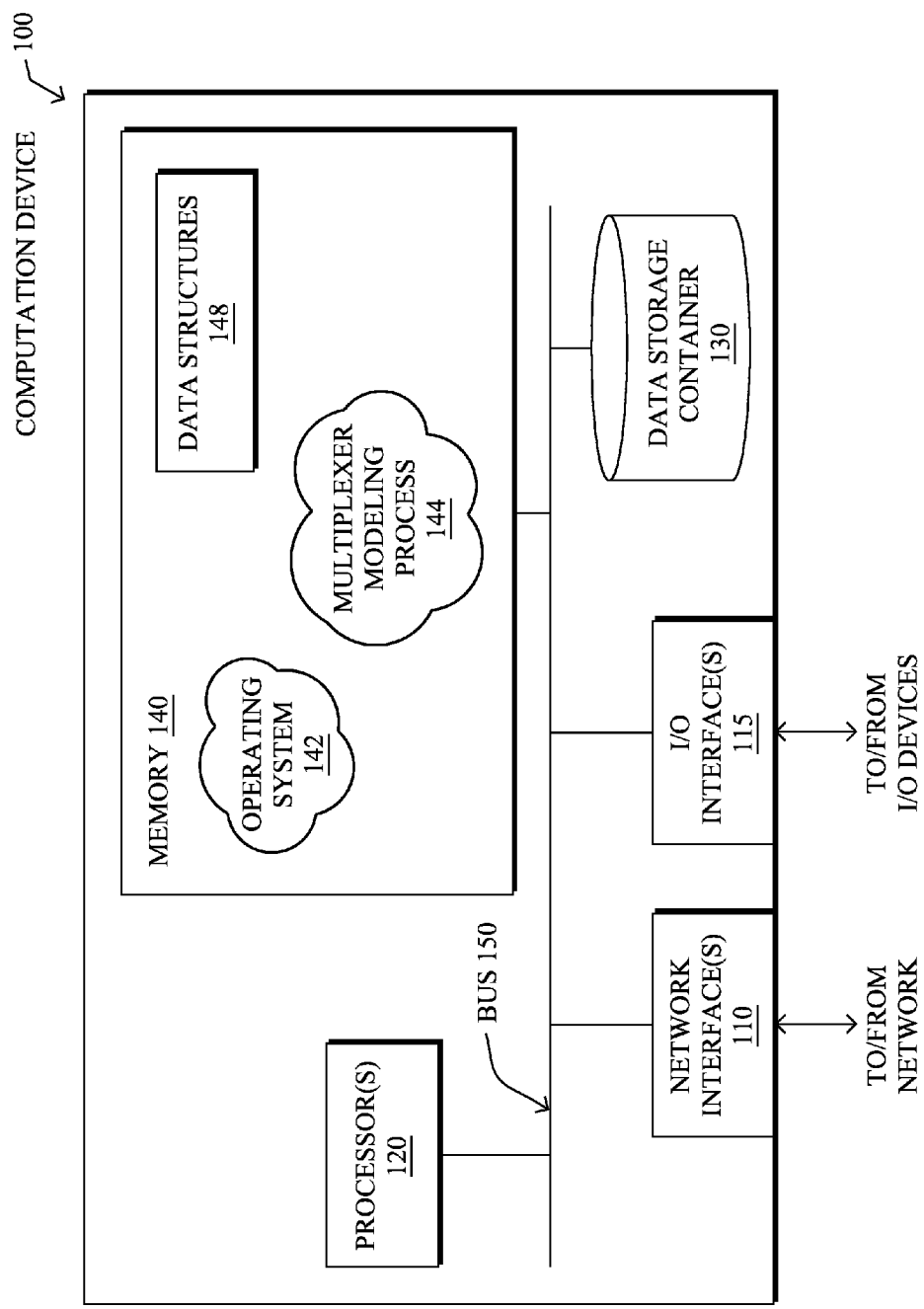
FIG. 1 is a schematic illustration of an example computing device.

FIG. 1 is a schematic block diagram of an example device 100 that may be used with one or more embodiments described herein, e.g., as a computational device. For example, device 100 may comprise a personal computer, laptop, or other equivalent device. The device may comprise one or more processors 120, a data storage container 130 (e.g., hard drives, optical drives, magnetic drives, etc.), and a memory 140 interconnected by a system bus 150. The device may also comprise network interfaces 110 for communicating data over a computer network, and one or more input/output (I/O) interfaces 115 for communicating signals with various input and/or output devices, such as a keyboard, mouse, monitor, etc., as will be understood by those skilled in the art.

The memory 140 comprises a plurality of storage locations that are addressable by the processor(s) 120 for storing software programs and data structures associated with the embodiments described herein. The processor 120 may comprise necessary elements or logic adapted to execute the software programs and manipulate the data structures 148 in memory. An operating system 142, portions of which are typically resident in memory 140 and executed by the processor(s), functionally organizes the device by, inter alia, invoking operations in support of software processes and/or services executing on the device. These software processes and/or services may comprise an illustrative multiplexer modeling process 144. It will be apparent to those skilled in the art that other types of processors and memory, including various tangible, non-transitory computer-readable media, may be used to store and execute program instructions pertaining to the techniques described herein. Also, while the embodiments herein are described in terms of processes or services stored in memory, alternative embodiments also include the processes described herein being embodied as modules consisting of hardware, software, firmware, or combinations thereof.

Multiplexer modeling process 144 may contain computer executable instructions executed by processor 120 to perform program instructions for use with modeling a passive multiplexer according to the embodiments described herein. For example, multiplexer modeling process 144 may be embodied as a standalone process used for modeling passive multiplexers for signal filters. Alternatively, process 144 may be embodied as a portion of a mathematical suite/program, capable of many mathematical computations, such as the MATLAB® computing environment available from The MathWorks, Inc., of Natick, Mass. For instance, the multiplexer modeling process 144 may be a component (e.g., a tool) within the mathematical suite that specifically allows for the modeling of passive multiplexers (e.g., analog filter design for use within a signal processing suite).

As an additional alternative, the multiplexer modeling process/program 144 may be embodied as a user interface block within a software-based simulation program, such as the Simulink® model-based design environment, also available from The MathWorks, Inc. In this embodiment, the user interface block may operate to compute multiplexer parameters for a modeled passive multiplexer as described herein, or may operate as the modeled passive multiplexer, thus according to computed multiplexer parameters. For instance, simulations of real-world systems may be modeled using block diagrams. Historically, engineers and scientists have utilized time-based block diagram models in numerous scientific areas, such as Feedback Control Theory and Signal Processing to study, design, debug, and refine dynamic systems. Dynamic systems, which are characterized by the fact that their behaviors change over time, are representative of many real-world systems. A dynamic system (either natural or man-made) is a system whose response at any given time is a function of its input stimuli, its current state, and the current time. A block diagram model of a dynamic system is represented schematically as a collection of blocks (user interface blocks) interconnected by lines that represent signals, where each block represents either an elemental dynamic system, or, particularly for the techniques described herein, a linearly time-invariant system.

As noted above, signal communication, such as wireless communication (e.g., radio frequency (RF), microwave, and satellite communication), generally utilizes well known signal filters for transmitting or receiving specific signal frequencies. The problem that is created once two or more filters are connected at a common junction (a duplexer or multiplexer) is where the two or more filters alter each other's performance characteristics from those originally intended. As mentioned, passive multiplexers for signal filters may be designed such that components of filters are reconfigured to return to the characteristics desired when each original prototype filter was designed. However, modeling of filter multiplexers has been an ongoing challenge in the state of the art for RF/microwave filter researchers and manufacturers, with each using their own "in-house" special techniques.

For instance, to model a passive multiplexer, experts in the field (e.g., hardware filter manufacturers) have used either labor-intensive physical testing (bench work), where RF filter engineers optimize the performance of a multiplexer by testing and measuring the physical hardware. Alternatively, generally inflexible and complex algorithms have been defined for use with modeling passive multiplexers, however these algorithms are typically slow to converge, or may not converge at all, thus not achieving a solution to nullify the effects of the common junction. For example, current techniques require unique algorithms for each multiplexer order case (i.e., a unique algorithm for a duplexer versus a triplexer). These algorithms are very complex applied mathematics algorithms used to come to a converged solution, and may not result in an optimal solution, often where little correlation can be made back to the respective individual filter's original parameters (e.g., an admittance matrix).

According to one or more embodiments of the invention, therefore, a passive multiplexer may be modeled through a computer-implemented technique that is simple and flexible, while at the same time providing better convergence than current techniques used in the art. Illustratively, the technique utilizes an initial resonant frequency offset vector estimation that may be calculated and input into a convergence algorithm to greatly assist the convergence, achieving better (e.g., faster, more frequent) convergence on a set of multiplexer parameters.

Figure 2A:
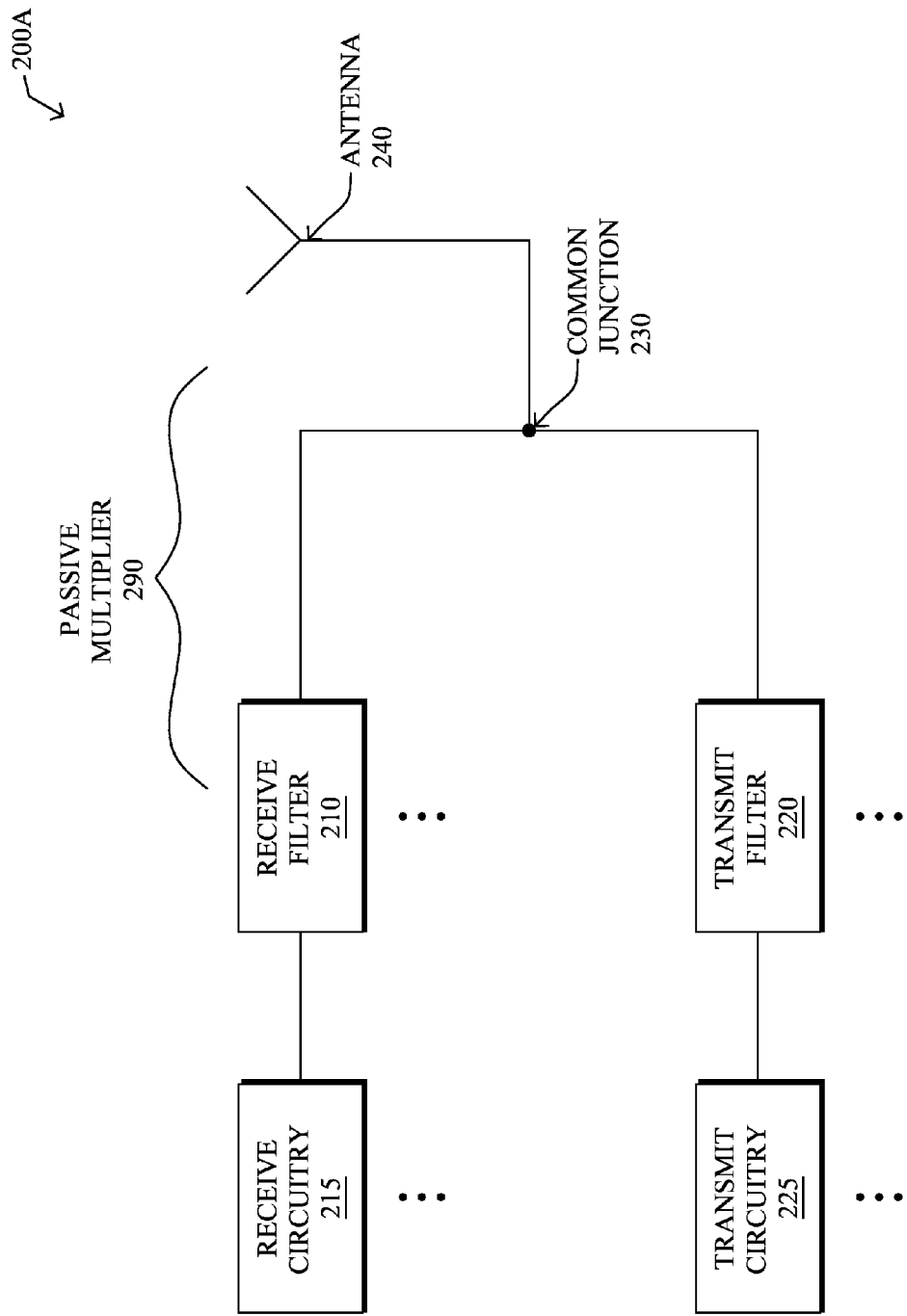
FIG. 2A is a schematic block diagram of an example communication circuitry.

Generally, FIG. 2A illustrates a schematic block diagram of an example communication circuitry 200 having a plurality of filters. In particular, a receive filter 210, along with corresponding receive circuitry 215 (e.g., low noise amps, etc.), may be interconnected to an antenna 240 at a common junction 230 with a transmit filter 220 and corresponding transmit circuitry 225 (e.g., high power amps, etc.). A passive multiplexer ("mux") 290 may be used to represent the filters and common junction, and is the focus of the invention described herein. Notably, a single receive filter and a single transmit filter are shown. However, the embodiments herein are applicable to any number of receive filters and any number of transmit filters, including having only receive filters or only transmit filters.

Figure 2B:
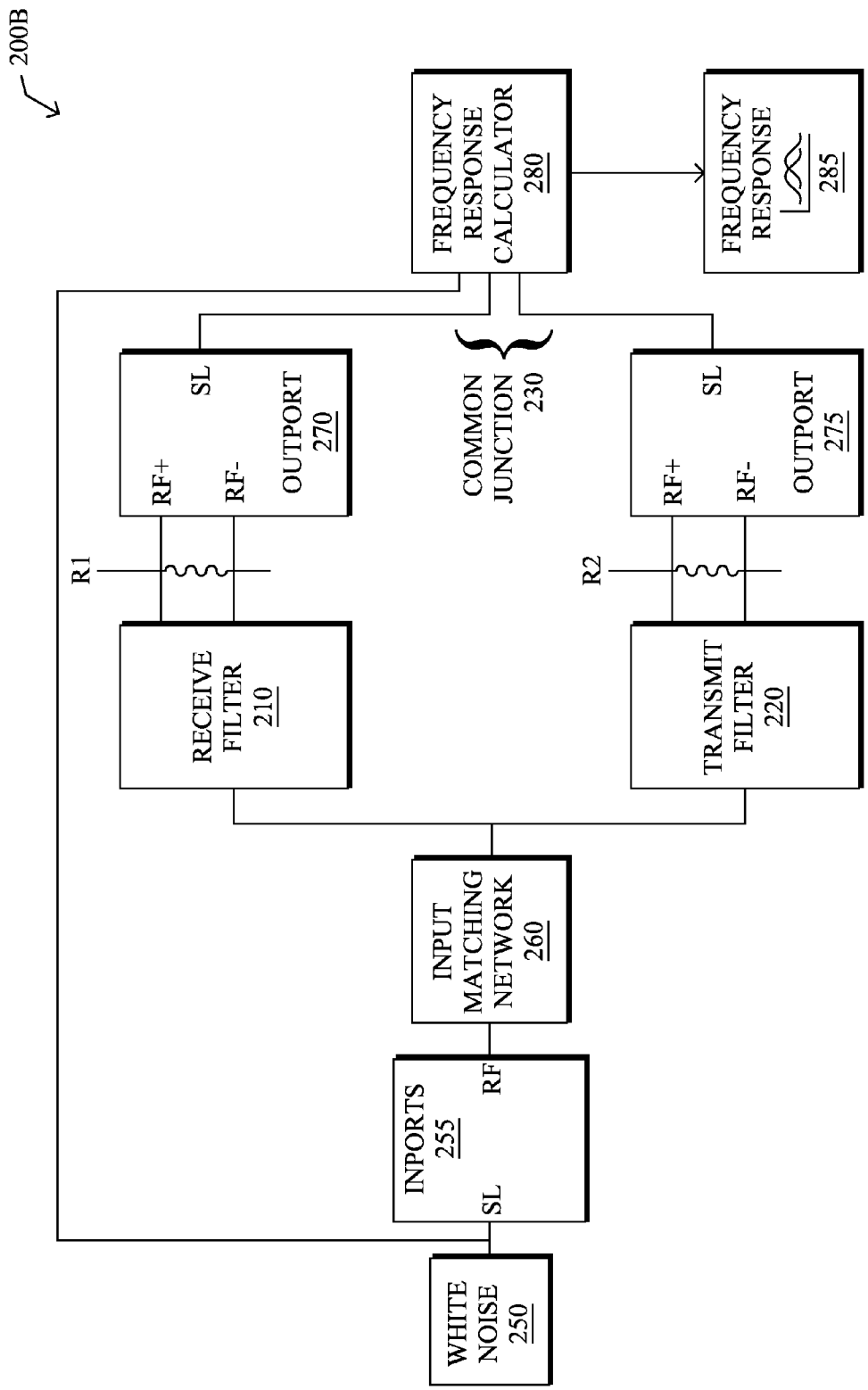
FIG. 2B is a schematic block diagram of an example frequency response generation circuit.

Additionally, FIG. 2B illustrates a schematic block diagram of an example frequency response generation circuit 200b (e.g., a filter duplexer) based on the filters of FIG. 2A. That is, as part of simulation and/or computation to determine frequency response of circuit 200, the circuit 200b may be used to generate a frequency response 285 obtained when the receive filter 210 and transmit filter 220 (and any other or alternative filters of circuit 200) are connected at the common junction 230.

Illustratively, circuit 200b comprises a white noise source 250 configured to supply signals (e.g., signal-level) across a spectrum of frequencies, which may be converted, if necessary, to RF-level signals at an inport process/box 255. An input matching network 260 may then treat the signals prior to distribution through the respective filters of the circuit 200b, as will be understood by those skilled in the art. Beyond each signal filter (and respective resistors R1 and R2), outports 270 and 275 may convert the RF-level signals back to signal-level, if necessary, prior to communicating the signals with a frequency response calculator 280. As a result of the frequency response calculator, a frequency response 285 may be determined for the circuit 200b, and thus for the multiplexer of circuit 200 in FIG. 2A and the corresponding filters at the common junction 230. (Those skilled in the art will appreciate that other circuits may be used to compute frequency response 285, and the circuit 200b shown herein is merely a representative example.)

The technique described herein used for multiplexer design and analysis may be considered a semi-analytical approach that starts with each of the respective filter's parameters (e.g., lowpass prototype values) and the outputs are generated component values for each filter and the multiplexer's frequency response. Each of the individual filters that populate the multiplexer are synthesized from well-established lowpass filter prototype algorithms, and component values for each of the respective filters are used to populate an admittance matrix describing the entire multiplexer subsystem. An initial calculation may be performed to estimate the resonant frequency offset of each of the resonators and hence filters in the multiplexer. Finally, an optimization technique may be used to iterate the independent variables to converge on parameters that achieve the desired frequency response.

Figure 3:
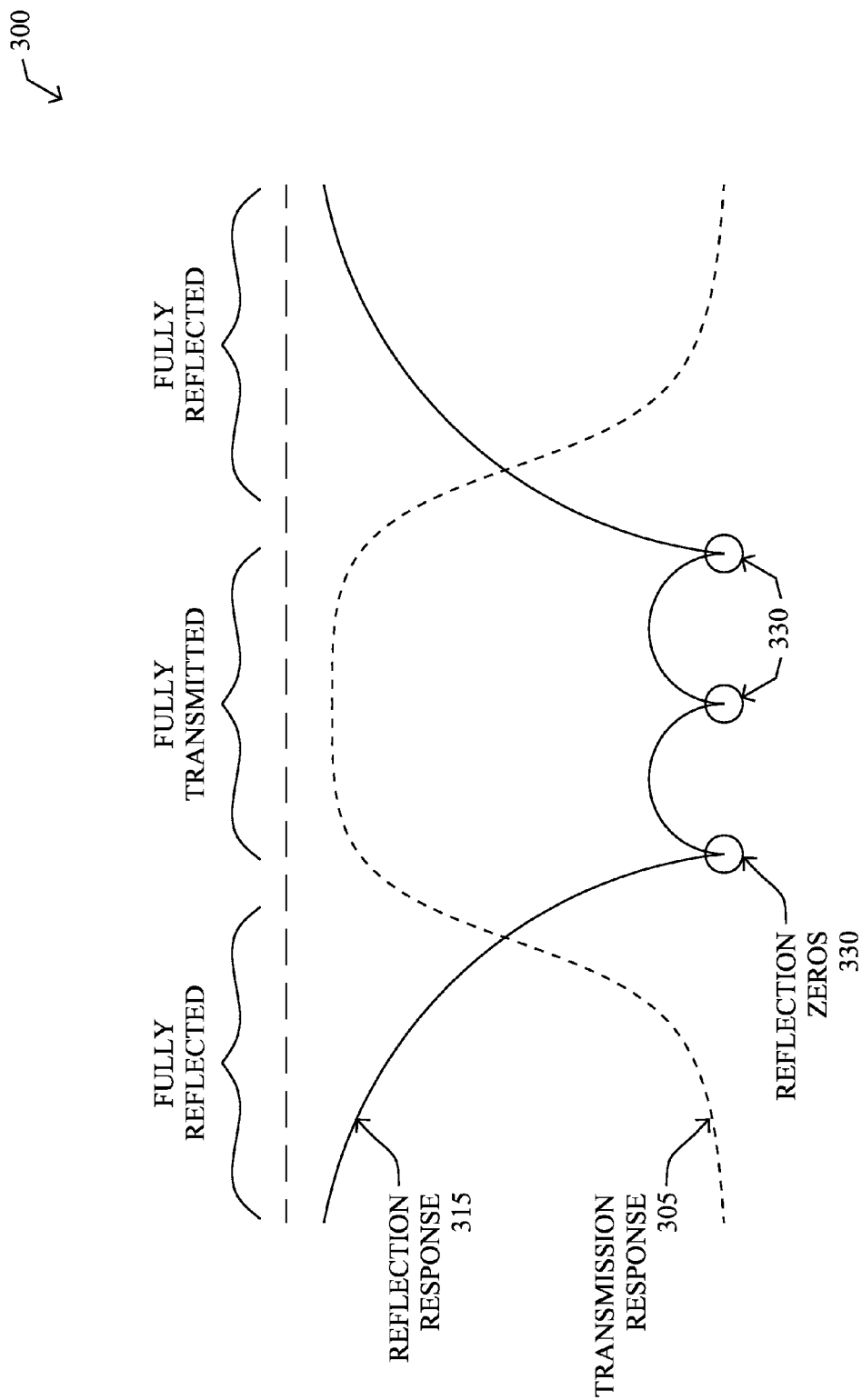
FIG. 3 is an example signal response chart.

For instance, FIG. 3 illustrates an example signal response chart 300 showing an example filter's frequency response. Assuming that a certain signal is received (for reception or transmission) at the filter, a transmission response is shown as dashed curve 305, and a certain reflection (or absorption) response 315 occurs where a certain portion of the signal is reflected (absorbed). When there is maximal reflection, there is minimal transmission, and when there is minimal reflection, there is maximal transmission. Illustratively, when the reflection signal 315 is at the reflection zeroes 330, the impedance of the filter/circuit is ideal, denoted herein as $Z_0$. Since as noted above, once this example filter is interconnected at a common junction with another filter, the frequency response 300 may be altered to an undesirable result. One of the goals of the system designers is thus to reconfigure the components (parameters) of the connected filters to return to the desired response shown in FIG. 3, i.e., the response intended when each original (e.g., prototype) filter was designed. The embodiments herein therefore describe a particular technique to synthesize these filter parameters, accordingly.

Figure 4:
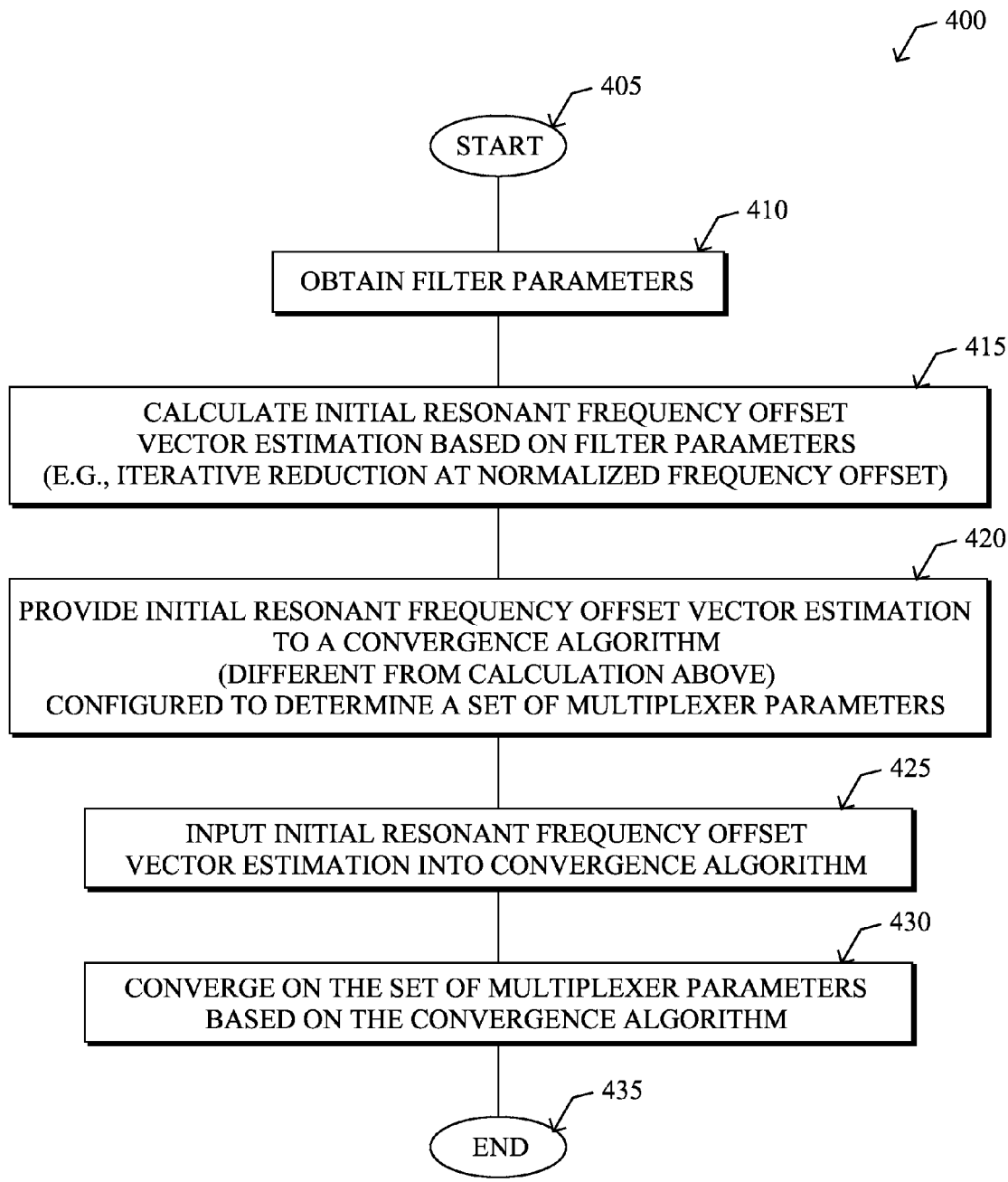
FIG. 4 is a simplified example procedure for modeling passive multiplexers for signal filters in accordance with one or more embodiments described herein.

As a brief overview of the invention as described in greater detail below, FIG. 4 illustrates a simplified example procedure for modeling passive multiplexers for signal filters in accordance with one or more embodiments described herein. The procedure 400 starts at step 405, and continues to step 410, where parameters may be obtained for individual signal filters of a plurality of signal filters of the passive multiplexer joined at a common junction. Based on the filter parameters, an initial resonant frequency offset vector estimation is calculated, for example, utilizing an iterative reduction at a computed normalized frequency offset for iterative combinations of resonant circuits connected at the common junction (and appropriately terminated) (step 415). In step 420, the initial resonant frequency offset vector estimation may then be provided to a convergence algorithm, notably one that is different from the estimation calculation above, such that once input into the convergence algorithm in step 425, the convergence algorithm may determine (converge on) a set of appropriate multiplexer parameters. The procedure 400 ends in step 435.

Modeling of Passive Multiplexers:

To begin, for a given plurality of filters to be connected at a common junction, such as various transmission filters, reception filters, RF filters, microwave filters, etc., each of the filter's parameters (e.g., an admittance matrix) are obtained in order to serve as inputs. Commonly these are known as "m-values" and "g-values," however in most general terms these are susceptances and coupling parameters generated from a lowpass prototype of the corresponding filter. Generally, these values are known in the art, or may be readily determined by one skilled in the art.

From the obtained parameters, an initial resonant frequency offset vector estimation may be calculated for use with various convergence algorithms to converge on a set of parameters for the passive multiplexer. In particular, as described in further detail below, calculation of the estimation may be performed based on the parameters through "iterative reduction" for iterative combinations (e.g., pairs) of resonant circuits connected at the common junction, where each iteration is performed at a normalized frequency offset for the iterative combinations. For instance, this estimation provides a beneficial entry point to any subsequent convergence algorithm. Generally, the mathematical relationship used to calculate the resonant frequency offset is a non-linear equation, and in one embodiment, certain simplifications may be made to reduce the relationship from non-linear to linear.

Specifically, to calculate the estimation according to one or more embodiments herein, a normalized frequency offset that each filter will be from 0 Hz (or other common offset basis) may first be established, e.g., in the lowpass domain. Note that this translates to some median frequency in the bandpass domain, and that those skilled in the art will appreciate the various known techniques that may be used to establish the normalized frequency offset.

Figure 5:
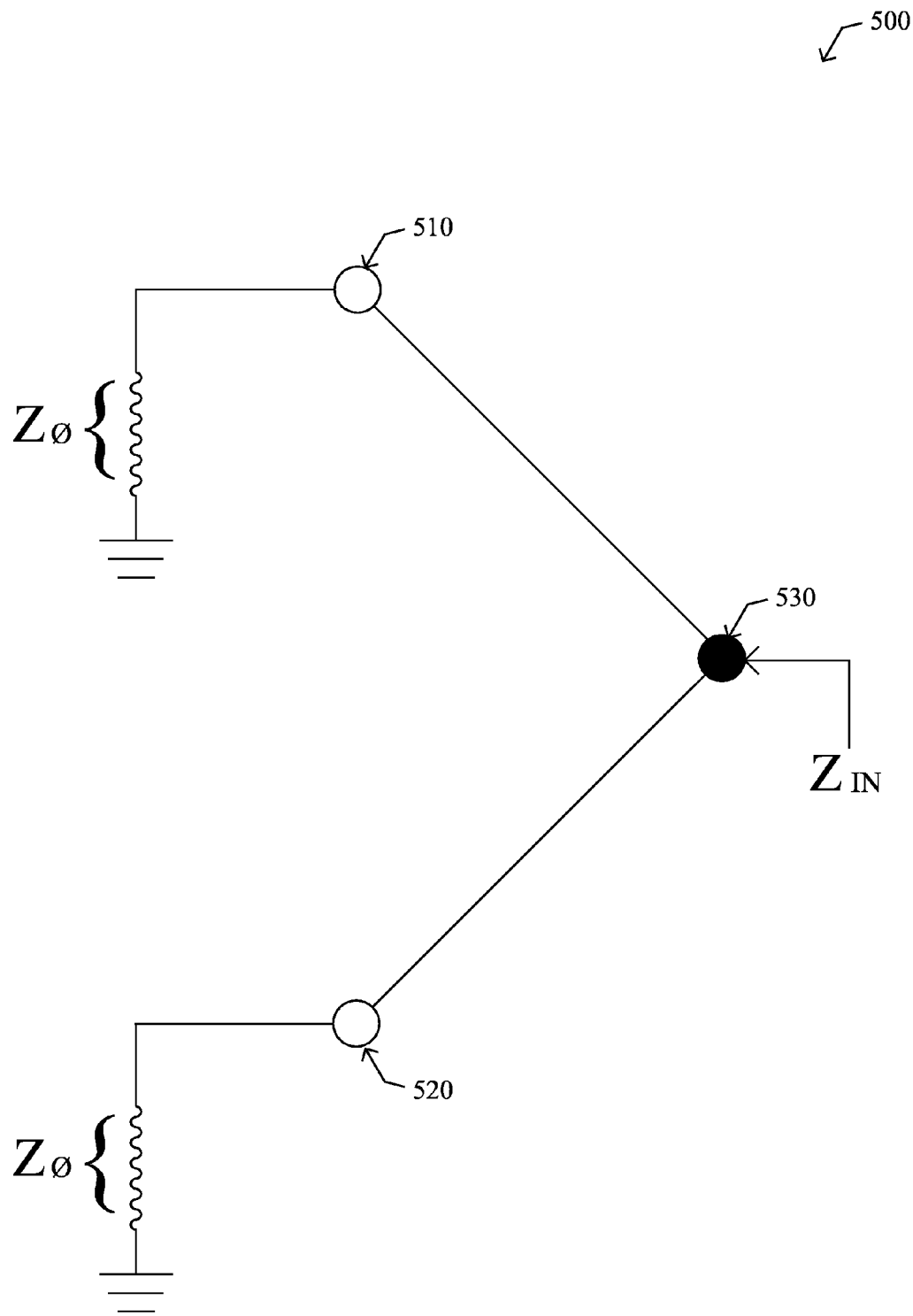
FIG. 5 is an example representation of a combination of resonant circuits interconnected to a common junction.

For each iteration, a combination (e.g., pair) of filters are selected that have approximately the same frequency offset from 0 Hz. Only the resonators that are connected to the common junction are considered and these are terminated in a load that is substantially equal to the characteristic impedance of the filters. For instance, FIG. 5 illustrates an example representation 500 of a combination of resonant circuits 510 and 520 extracted from the selected filters of the combination interconnected to a common junction 530. By terminating each resonant circuit in a matching load $Z_0$, (e.g., 50 ohms), a condition for $Z_{in}$ at the common junction is:

$$Z_{in\{\omega=\pm\omega_0\}} = Z_0 \quad \text{(Eq. 1)}$$

where $+\omega_0$ is due to transmit filters of the combination, and $-\omega_0$ is due to receive filters.

Another condition is then set that an input reflection coefficient vector at the common junction is set to (substantially) zero ($S_{11}=0$) at the center frequencies of each of the respective filters. A mathematical tool called a frequency-invariant susceptance may then be introduced so as to calculate a resonant frequency offset vector estimation to achieve the previously stated condition, i.e., an "ideal" match (or idealized approximation per filter combination) at the normalized frequency offset, resulting in a quadratic equation that may be used as the initial guess point for optimization, as described below. That is, for each resonator (resonant structure/circuit) in each of the respective filters of the combination, an estimation may then be made at their resonant frequency offset parameter based off the technique described above at subsequent normalized frequency offsets.

To complete the iterative reduction, the technique above is repeated for each additional filter combination (if any), until a single "initial" resonant frequency offset vector estimation has been computed based on all of the connected filters (thus a "final" iteration produces the "initial" estimation). The initial estimation may then be provided (input) to a selected convergence algorithm to determine a set of multiplexer parameters. As noted, the convergence algorithm may be different from the initial resonant frequency offset vector estimation calculation.

Generally, the convergence algorithm is configured to determine a set of multiplexer parameters such that the ideal/desired conditions ($f^{opt}$) closely match (e.g., equal) what the convergence algorithm outputs ($f^{pres}$) or namely that:

$$[f^{opt}(\bar{x}_0)] = [f^{pres}(\bar{x})] \quad \text{(Eq. 2)}$$

which, as an example using 50 ohms as $Z_o$ may each be represented as:

$$\begin{bmatrix} 50 \\ 0 \\ 50 \\ 0 \\ 50 \\ 0 \end{bmatrix} = \begin{bmatrix} ? \\ ? \\ ? \\ ? \\ ? \\ ? \end{bmatrix} \quad \text{(Eq. 3)}$$

The convergence itself converges the error, which may generally be described as:

$$[\Delta f^{pres}(\bar{x})] = [\Delta f^{opt}(\bar{x}_0)] - [\Delta f^{pres}(\bar{x})] \quad \text{(Eq. 4)}$$

From here, a selected optimization technique may be used (e.g., Newton-Raphson, a multivariate Taylor series, or other similarly situated and acceptable optimization techniques) to assist in the convergence of the multiplexer's parameters, such as the illustrative example optimization technique described below.

According to one or more embodiments of the invention, the following specific convergence technique may be used, though others may also take advantage of the initial resonant frequency offset vector estimation from above. To initialize this illustrative convergence algorithm, an initial match frequency vector based on the parameters may be calculated such that the input reflection coefficient vector substantially equals zero. That is, the input reflection coefficient vector is calculated that corresponds to reflection zeroes of each of the filters, where $S_{11}=0$ (e.g., providing precision for system, based on the filter parameters). Notably, certain parameters may be adjusted/input based on differing bandwidths of the filters as well, such that the input reflection coefficient vector substantially equals zero when taking into account those differing bandwidths, accordingly. From here, the parameters to optimize may then be defined, as described below.

In addition, during a first convergence iteration, an initial input impedance vector may be calculated from the initial match frequency vector based on the initial resonant frequency offset vector estimation and the obtained filter parameters. Note that for the convergence of the parameters, the g-values corresponding to individual filters may remain constant, while the m-values change based on the filters' interconnection, hence, the convergence is generally interested in the m-values, accordingly. As described in more detail below, the remainder of the illustrative convergence algorithm iterates the calculation of an updated input impedance vector for a correspondingly updated match frequency vector based on updated resonant frequency offset vectors to converge on the multiplexer parameters. In particular, the updated resonant frequency offsets are based on the difference between a present input impedance vector and an ideal input impedance vector where the input reflection coefficient vector for the multiplexer substantially equals zero, as mentioned above. Specifically, for each convergence iteration, the parameters corresponding to each of the filters are repopulated such that before each subsequent iteration, the new (present) offset is based on the old offset plus a correction value determined through the convergence algorithm:

$$\bar{x}^{pres} = \bar{x}^{old} + \Delta\bar{x} \quad \text{(Eq. 5)}$$

For instance, as described in more detail below, an approximation may be made that is a multi-variable analog of a single root finding routine, where:

$$[\Delta f(\bar{x})] = \left[\frac{\partial f(\bar{x})}{\partial \bar{x}_i}\right][\Delta x] \quad \text{(Eq. 6)}$$

resulting in a correction vector of:

$$[\Delta x] = \left[\frac{\partial f(\bar{x})}{\partial \bar{x}_i}\right]^{-1}[\Delta f(\bar{x})] \quad \text{(Eq. 7)}$$

In more detail, to iterate the convergence calculation above, the difference between the ideal values (e.g., where $S_{11}=0$) and the present values of the input impedance vector is determined. Specifically, as shown in more detail below, a sparse diagonal admittance matrix may be set up describing the multiplexer, and a subsequent impedance matrix may be calculated so as to be able to determine the S-parameters from the admittance matrix values. Also, as noted, the present values of the input impedance vector may be calculated and an error vector (correction vector) may be calculated that is the difference between the optimal value of the input impedance vector and the present value.

Furthermore, in order to minimize the difference between the present input impedance vector and the ideal input impedance vector (the error calculated above), correction values for selected parameters, e.g., the frequency offset and the filter parameters, may be calculated. For example, as described in more detail below, a Jacobian of the admittance matrix may be calculated at each of the match frequencies so as to calculate the corrections for each of the parameters to be optimized.

Figure 6:
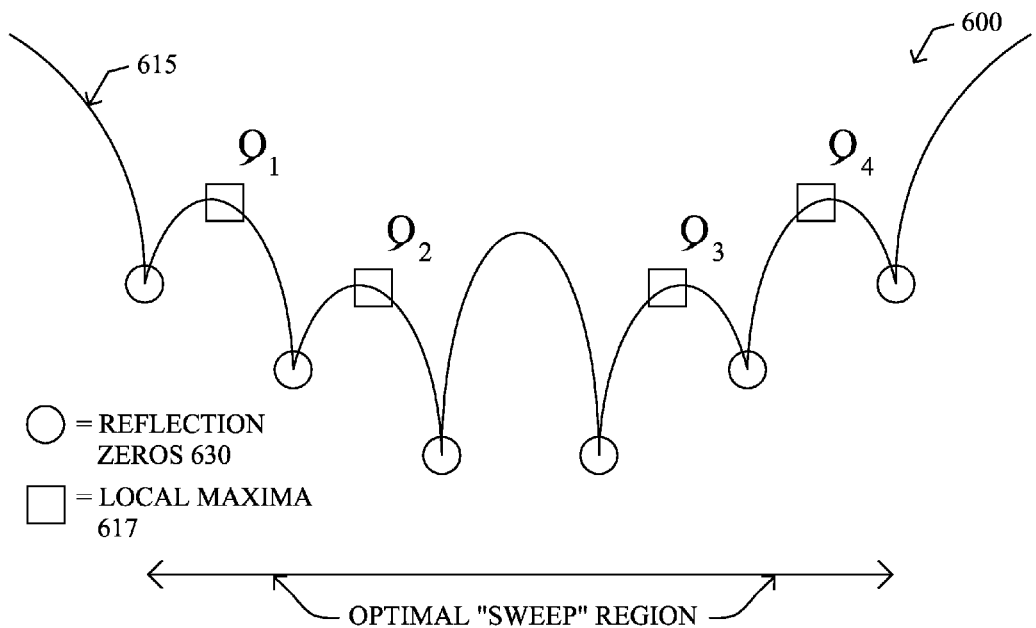
FIG. 6 is a coarse frequency response calculation resulting in a reflection response.

With the updated parameters, an updated match frequency vector may be calculated based on calculating a coarse frequency response of the multiplexer. For instance, as shown generically in FIG. 6, a coarse frequency response calculation results in some form of reflection response 615 having a plurality of local maxima 617 (shown as squares, and labeled as $\rho_{1-4}$) within an optimal "sweep region" between each of the outermost reflection zeroes 630 (shown as circles) as shown, or simply from one reflection zero to another. In particular, a sweep is performed between each of the reflection zeroes within the sweep region to calculate the local maxima (frequency and magnitude) of the input reflection coefficient. From this, a correction of the inner reflection zero frequencies may then be calculated based on a parabolic approximation. Graphically, the desired outcome is an equivalent magnitude of the local maxima 617 ($\rho_{1-4}$) in FIG. 6, where the geometric median may be found as:

$$(\rho_1 \rho_2 \ldots \rho_n)^{1/n} \tag{Eq. 8}$$

Figure 7:
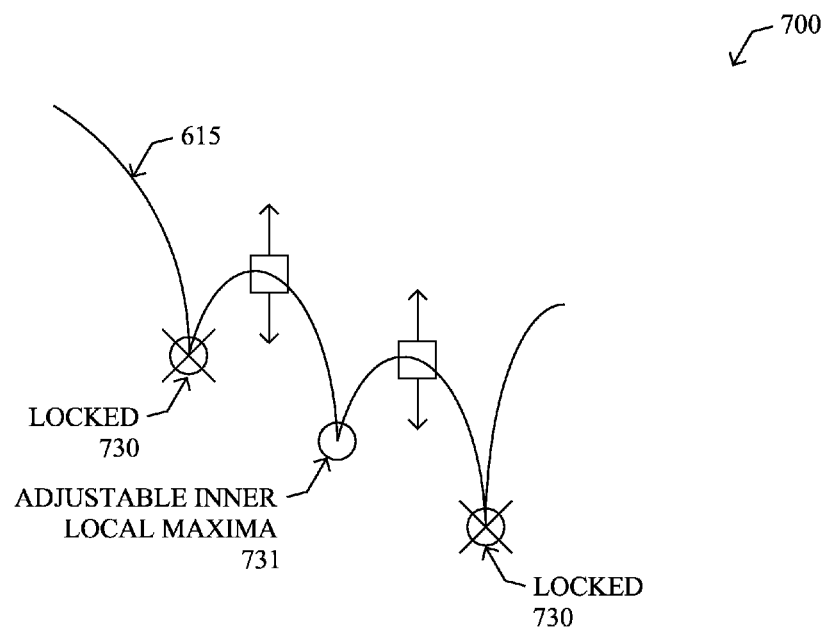
FIG. 7 is a graphical representation of adjusting local maxima of a reflection response.

In order to adjust the magnitudes of the local maxima, a pair of "end" reflection zeroes of the sweep region may be locked, and reflection zeroes between the locked ends may be adjusted, e.g., approximating the response to a parabola. FIG. 7 illustrates this graphically, where a center (inner) reflection zero 731 between end reflection zeroes 730 on a reflection response curve 715 may be moved to adjust the magnitudes, accordingly. Notably, this is described in greater detail below, particularly with reference to equation/derivation 31 (FIG. 32).

The illustrative convergence algorithm repeats with updated frequency points, thus iteratively recalculating updated input impedance vectors for updated match frequency vectors, producing an updated $f_{pres}(\bar{x})$. The iterations may repeat until either a maximum number of iterations is reached or some error limit value (threshold difference) is obtained between the present input impedance vector and the ideal input impedance vector.

Figure 8A:
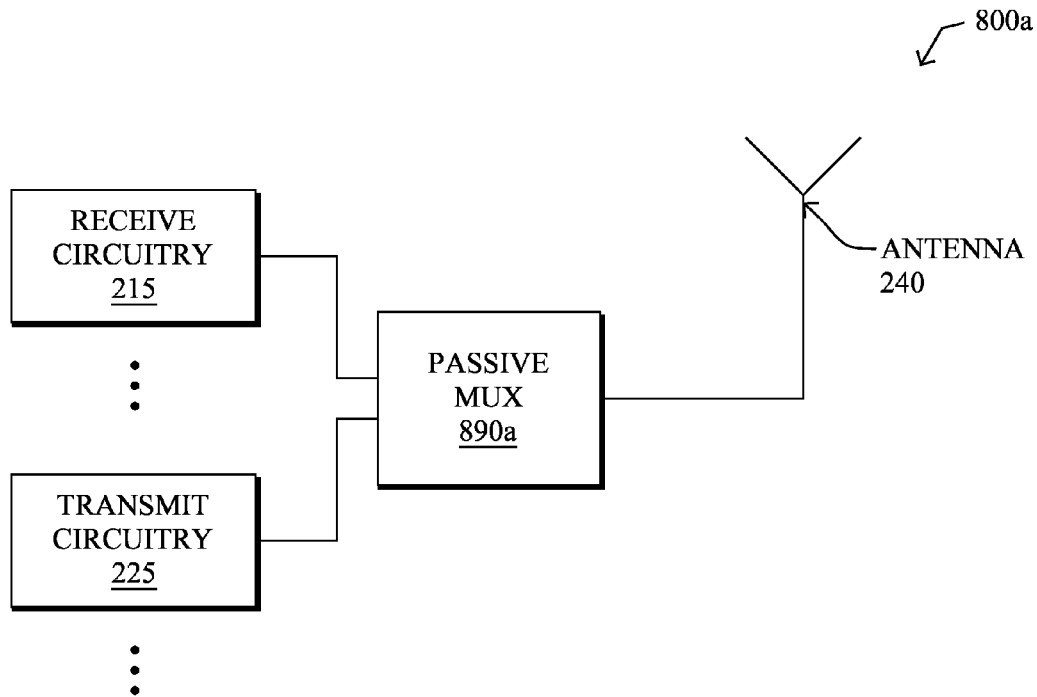
FIG. 8A is a schematic block diagram of the communication circuitry of FIG. 2A, having replaced the filters with a passive multiplexer.
Figure 8B:
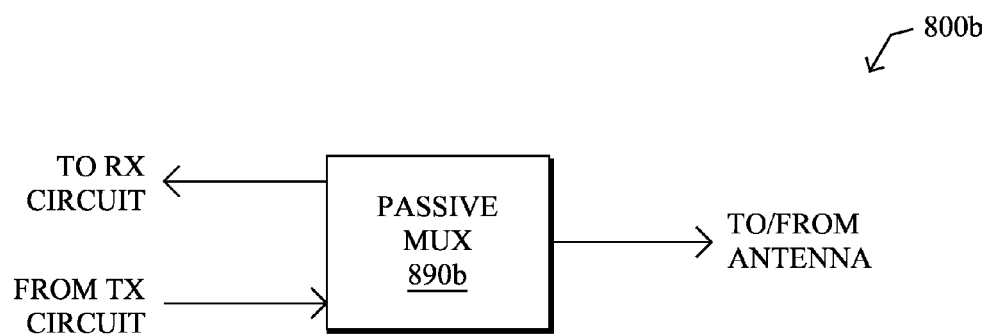
FIG. 8B is an example passive multiplexer block for a software-based simulation user interface.

Assuming convergence, an admittance matrix may be generated that mathematically describes the combination of all filters and the common junction, i.e., the modeled multiplexer. Generally, the multiplexer parameters may represent m-values that differ from the m-values of the filters, g-values that are the same as the g-values for the filters, and final updated resonant frequency offset vectors as computed during the convergence. The converged multiplexer parameters, e.g., the admittance matrix representing the multiplexer parameters, may then be used to design a system. For instance, physical passive multiplexers may be designed for implementation in the field. For example, FIG. 8A represents a schematic block diagram of the communication circuitry 200 of FIG. 2A (now 800a), having replaced the filters with a passive multiplexer 890a. Alternatively, the multiplexer parameters may be used to generate a software-based simulation user interface block according to the multiplexer parameters for the modeled passive multiplexer. Illustratively, FIG. 8B represents an example passive multiplexer block 890b ready for insertion between receive and/or transmit circuitry signals and antenna signals within a software-based simulation user interface 800b.

The following description further illustrates the techniques described above in greater mathematical details for an illustrative multiplexer (e.g., a duplexer), though as will be appreciated by those skilled in the art, still approaches the description from a high level. Assume, for example, that each filter can be represented by its respective $Z_{in}$ vector as shown in Equation 9 (Eq. 9) of FIG. 9, and thus that the culmination of the filters at the common junction equates to $Z_{in}^{nom}[\bar{x}]$ as shown. (Note again that a common value for $Z_o$ is 50 ohms.) Furthermore, $Z_{in}^{nom}[\bar{x}]$ can be represented by Eq. 10 (FIG. 10). From this it can be seen that Eq. 11 (FIG. 11) represents $[Z_{in}]$, and also that $[\Delta \bar{x}]$ is represented by Eq. 12 (FIG. 12).

In addition, Eqs. 13 and 14 (FIGS. 13 and 14) illustrate conventional admittance matrixes [Y] to describe illustrative transmit and receive filters, respectively. Within each matrix [Y], a sub-matrix [Y]' can be obtained from the lower right 3×3 quadrant, as shown in Eqs. 15 and 16 (FIGS. 15 and 16), respectively. According to the invention, these sub-matrices may then be inserted into the sparse admittance matrix $[Y^{MUX}]$ for the multiplexer as shown in Eq. 17 (FIG. 17). This admittance matrix $[Y^{MUX}]$ may thus be used to compute $f^{pres}(\bar{x})$ as illustrated above.

Eqs. 18 and 19 (FIGS. 18 and 19) are paramount equations known in the art to take $[Y^{MUX}]$ of Eq. 17 to optimize the internal filter elements, which thus leads to Eq. 20 (FIG. 20), accordingly.

From Eq. 9 (FIG. 9), there are six frequencies where the condition of $Z_{in}(s) = Z_0 + j0$, thus resulting in twelve equations. For the multiplexer, six new variables may be introduced and the values of the couplings may be optimized. As a result of the loading, the diagonal of the admittance matrix $[Y^{MUX}]$ in Eq. 17 needs to be modified as shown in Eq. 21 (FIG. 21). Also, the $M_{n-1,n}$ values may be optimized as well. This results in twelve equations in twelve unknowns.

Figure 22:
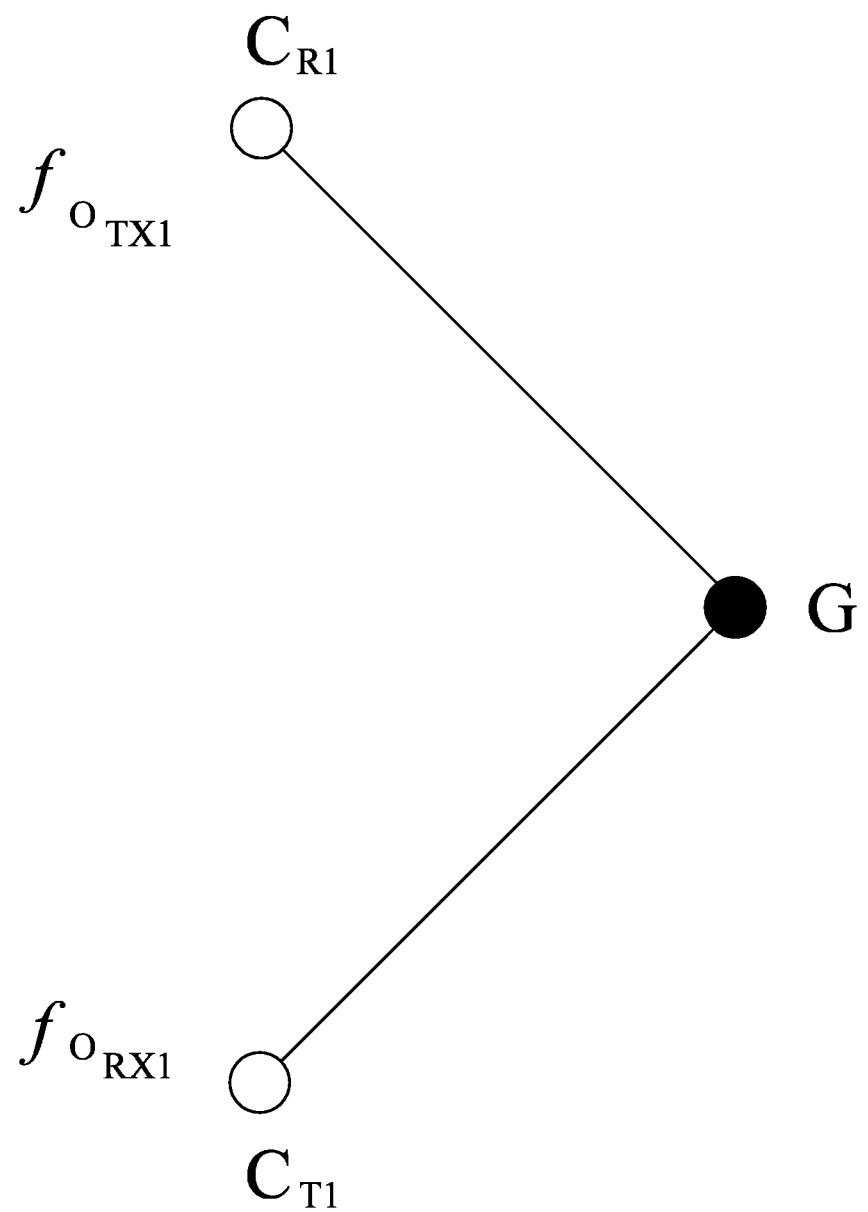
FIG. 22 is a circuit showing two resonant circuits connected at a common junction.

To set the initial guesses (estimations) for the frequency-invariant susceptances, we determine the offsets for these susceptances in a manner similar to that above described with reference to FIG. 5. For example, as shown in FIG. 22, the two resonant circuits $C_{R1}$ and $C_{T1}$ are connected at a common junction G. Accordingly, with reference to FIG. 22, the admittance matrix of Eq. 22 (FIG. 23) may be established to allow discovery of the eigenvalues to be used as the initial resonant frequency offset vector estimation described above. (Illustratively, the subsequent susceptance values may also be set as fractions of their previous values or other techniques can be used to calculate the subsequent susceptance values.)

In order to derive the input susceptance, an impedance matrix may be calculated as the inverse of the admittance matrix. To assist these calculations, values for G in Eq. 22 may be replaced with "r" values, and $sC_1$ or $sC_4$ may be replaced with $j(\omega - \omega_1)(C_1) - b_1$), and $j(\omega + \omega_1)(C_1 + b_1)$, respectively, as may be appreciated by those skilled in the art. The converted admittance matrix [Y] is thus shown in Eq. 23 (FIG. 24), where a simplification of the admittance matrix is shown in Eq. 24 (FIG. 25). From this simplified admittance matrix, an inverse [Z] may be computed as shown in Eq. 25 (FIG. 26, where the matrix entries for Z1-Z9 are shown separately in the Figure due to size constraints).

The numerator and denominator (of $S_{11}$) of the inverted admittance matrix may then be calculated from the relation in Eq. 18 (FIG. 18), such that the numerator is shown in Eq. 26a (FIG. 27) and the denominator is shown in Eq. 26b (FIG. 27). To set up the equation to solve for $B_1$, the result of "den- 2*num," as shown in Eq. 26c (FIG. 27) may then be used as the end result for the initial guess for the optimization/convergence.

Figure 29:
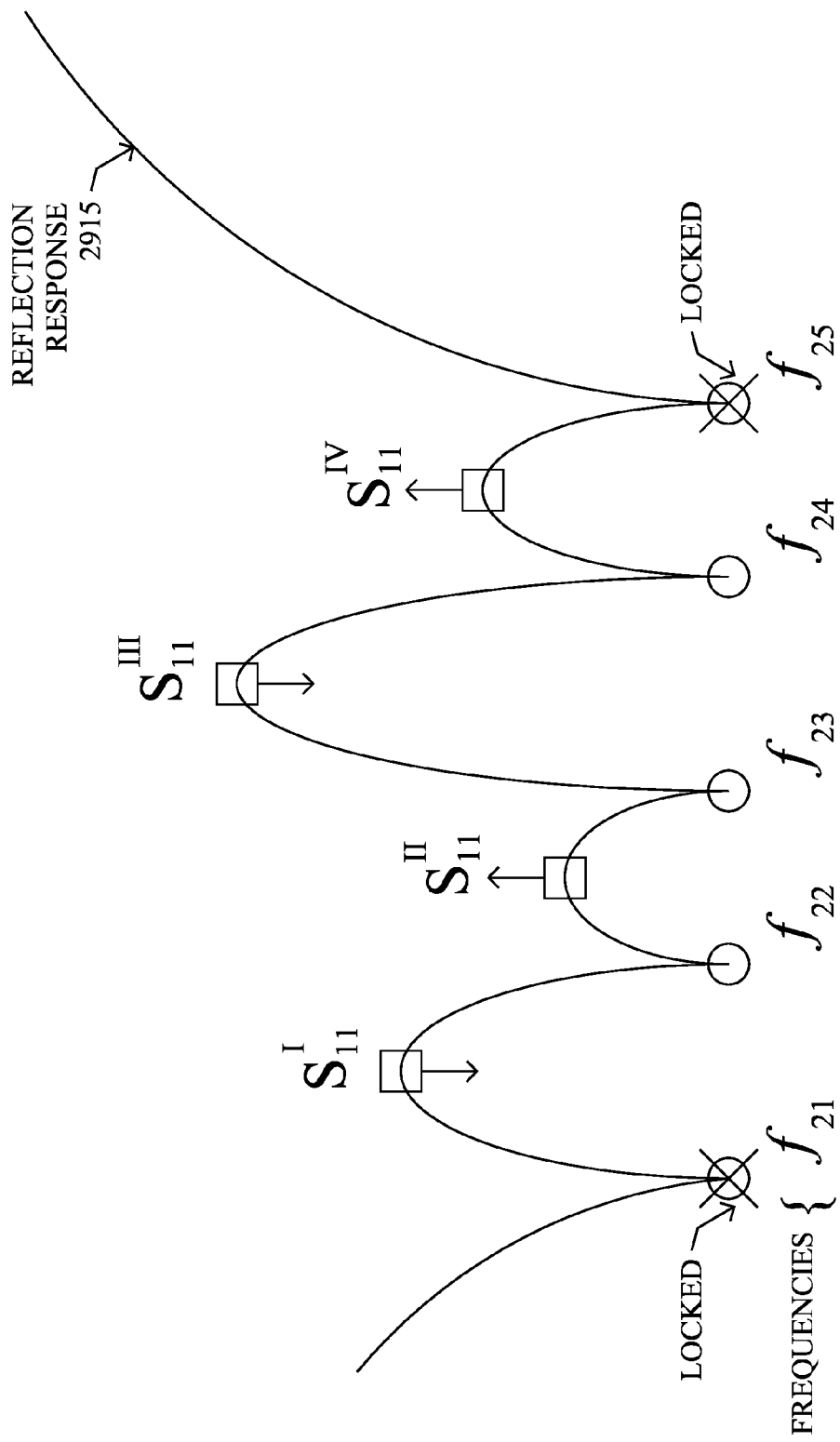
FIG. 29 is a calculated reflection response.

During the process of attaining convergence, such as the illustrative convergence algorithm above, the Jacobian may be calculated as shown in Eq. 27 (FIG. 28). Additionally, as noted above, to establish an equiripple response (based on a coarse frequency response from the interim converged values), the inner reflection zeroes may need to be adjusted. Illustratively, FIG. 29 illustrates a calculated reflection response 2915 (similar to FIG. 7) where between two outer "locked" frequencies $f_{21}$ and $f_{25}$ exist three other reflection zeroes (represented by circles), namely at frequencies $f_{22}$, $f_{23}$, and $f_{24}$. The local maxima (represented by squares) may be labeled from $S_{11}^I$ to $S_{11}^{IV}$. As mentioned, the local maxima can be calculated using a quick frequency sweep, and the response of the reflection function between consecutive zeroes can be approximated by a parabola. Also, the equiripple level can be approximated by Eq. 29 (FIG. 30), which progresses into Eq. 30 (FIG. 31). From Eq. 30, Eq. 31 (FIG. 32) may be used to determine $f_{Z2new}$, referred to above as: $f^{pres}(\overline{x})$.

Figure 33:
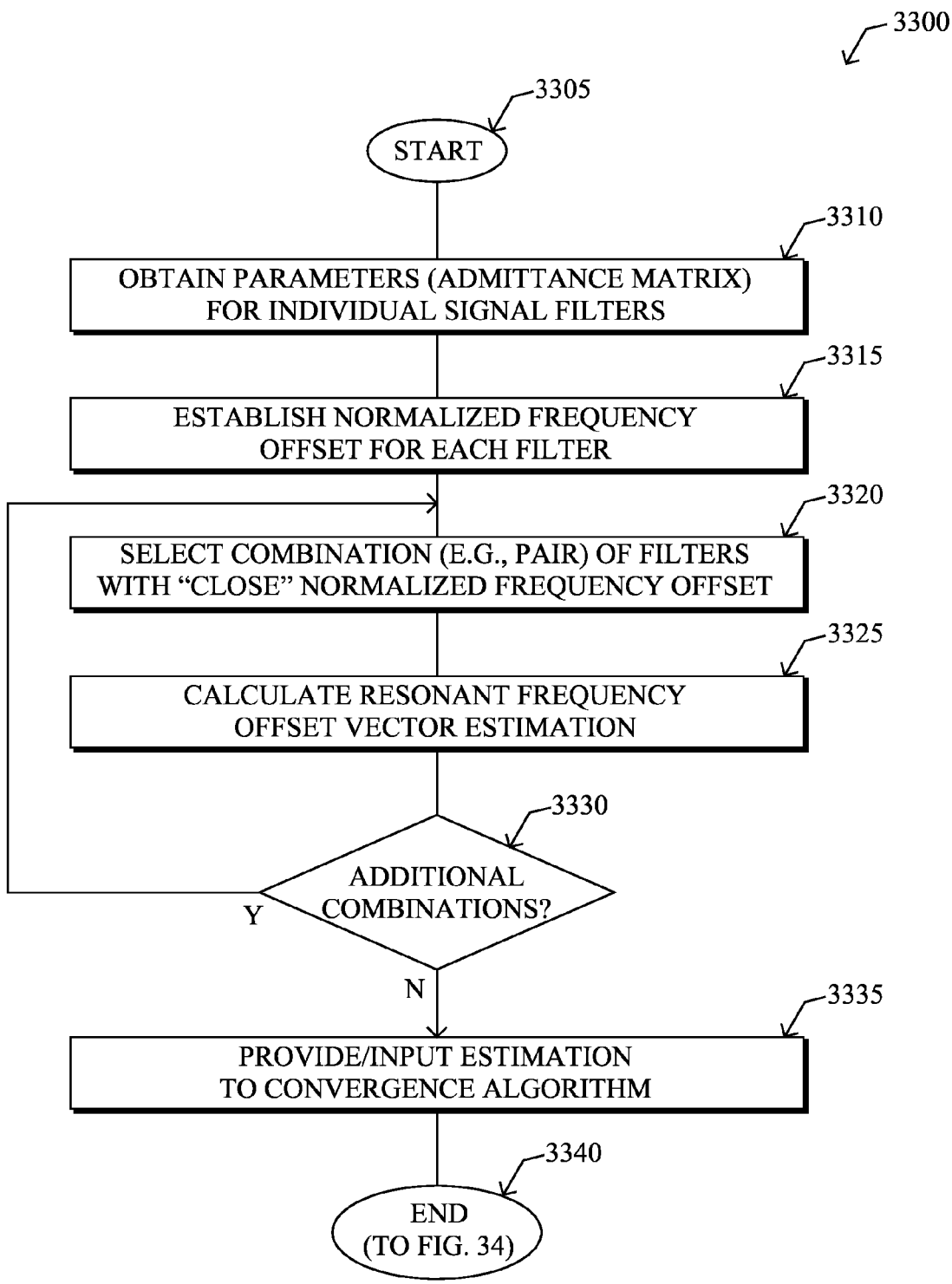
FIG. 33 is a simplified example procedure for use with modeling passive multiplexers for signal filters in accordance with one or more embodiments described herein.

In closing, and as a representative summary of the invention as described herein, FIG. 33 illustrates a simplified example procedure for use with modeling passive multiplexers for signal filters in accordance with one or more embodiments described herein. The procedure 3300 starts at step 3305, and continues to step 3310, where parameters (e.g., an admittance matrix) are obtained for individual signal filters of a plurality of signal filters of the passive multiplexer joined at a common junction.

In step 3315, a normalized frequency offset (e.g., from 0 Hz) for each filter may be established/calculated, e.g., in a lowpass domain, and then in step 3320, a combination (e.g., pair) of filters may be selected that have a "close" (e.g., approximately the same) normalized frequency offset. For example, the corresponding resonators of the selected filters may be terminated in a load that is substantially equal to a characteristic impedance of the selected filters and the resonant frequency offset vector estimation may be calculated in step 3325, e.g., such that the input reflection coefficient vector at the common junction is substantially zero at the center frequencies of each of the respective selected filters, as described above. That is, as mentioned above, for each resonant structure in each respective filter, a calculated estimation is made at subsequent normalized frequency offsets.

If there are additional filter combinations in step 3330, then the iterative reduction is repeated for each additional filter combination, however, if at step 3330 there are to be no further iterations, then the procedure 3300 continues to step 3335 to provide/input the initial estimation (of a final iteration) to the convergence algorithm that is configured to determine a set of multiplexer parameters, and that is different from the initial resonant frequency offset vector estimation calculation. The procedure 3300 ends in step 3340, which illustratively continues to step 3405 of FIG. 34.

Figure 34:
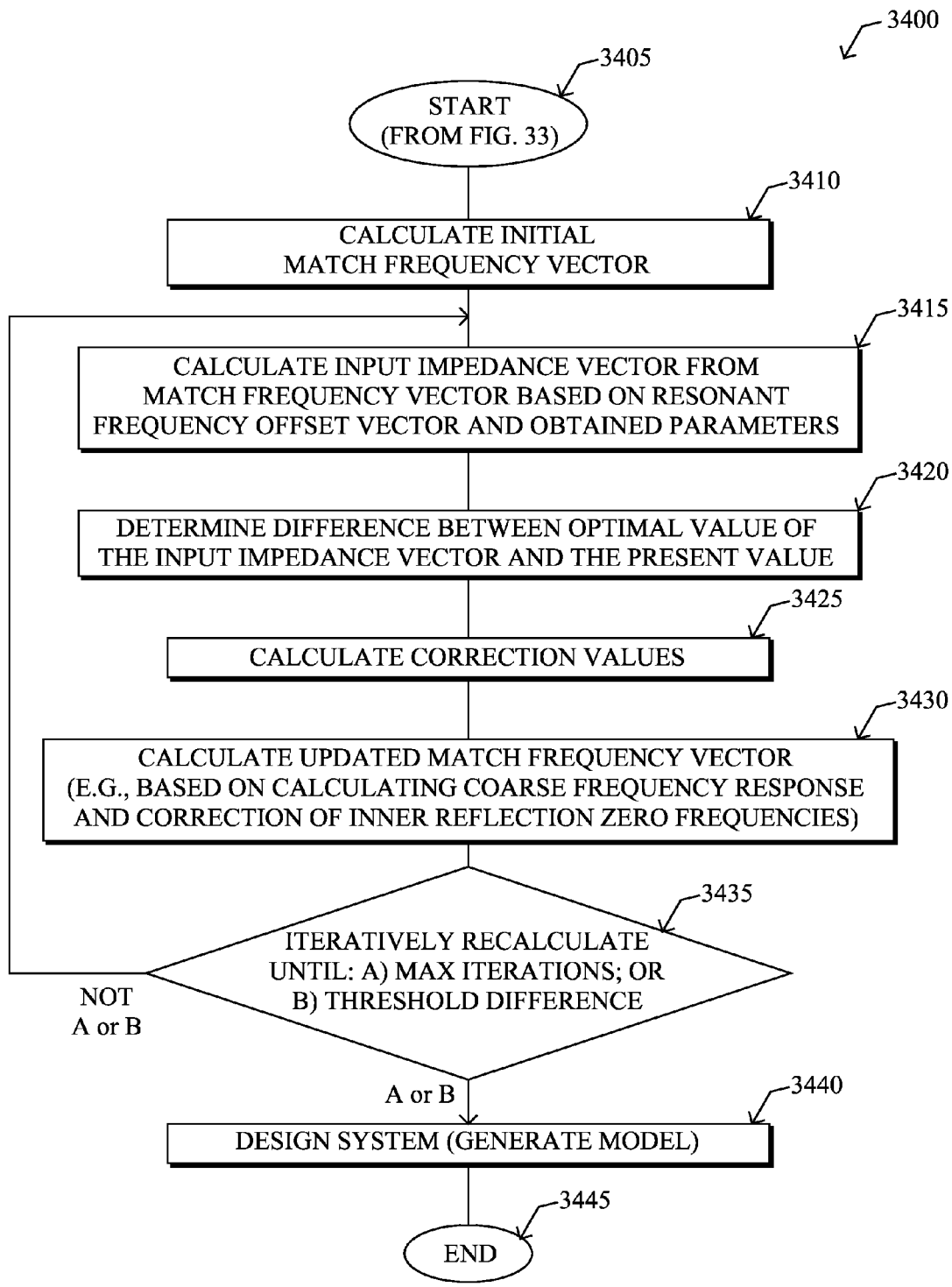
FIG. 34 is another simplified example procedure for use with modeling passive multiplexers for signal filters in accordance with one or more embodiments described herein.

In particular, FIG. 34 illustrates another simplified example procedure for use with modeling passive multiplexers for signal filters in accordance with one or more embodiments described herein. The procedure 3400 starts at step 3405 (from FIG. 33), and continues to step 3410, where an initial match frequency vector may be calculated based on the parameters (and differing bandwidths) of the filters such that the input reflection coefficient vector substantially equals zero. Further, in step 3415, an input impedance vector may be calculated from the initial match frequency vector based on a resonant frequency offset vector and obtained parameters.

Note that for the first pass at step 3415, according to the inventive technique, the initial resonant frequency offset vector estimation is used to assist in the convergence.

Upon determining a difference between an optimal value of the input impedance vector and a present value in step 3420, appropriate correction values may be calculated in step 3425. Specifically, in one embodiment as described above, in step 3420 a sparse diagonal admittance matrix may be arranged describing the multiplexer, and the subsequent impedance matrix may then be calculated to determine the S-parameters from the admittance matrix values. The present values of the input impedance vector are then calculated, and an error vector is calculated that is the difference between the optimal value of the input impedance vector and the present value. Correction values for selected parameters are then calculated in step 3425 in order to minimize the difference between the present input impedance vector and the ideal input impedance vector (e.g., a Jacobian).

Next, in step 3430, an updated match frequency vector may be calculated, e.g., based on results obtained from calculating a coarse frequency response of the multiplexer using the parameters as noted above. In particular, in step 3430, between each reflection zero frequency, a local maxima of the input reflection coefficient may be calculated, leading to calculation of a correction of the inner reflection zero frequencies, e.g., based on a parabolic approximation as described in detail above.

Recalculation may occur iteratively in step 3435, returning to step 3415, until either a maximum number of iterations is reached or some threshold difference is obtained between the present input impedance vector and the ideal input impedance vector. Accordingly, once the iterations are complete (assuming convergence on multiplexer parameters), then in step 3440 the passive multiplexer may be modeled and/or used to design a system. For example, a software-based simulation user interface block may be generated according to the multiplexer parameters for the modeled passive multiplexer, e.g., for use in simulation software. The procedure 3400 ends in step 3445.

Advantageously, as noted above, the novel techniques described herein may be used to model passive multiplexers for any number of filters, particularly providing better (e.g., faster, more frequent/reliable) convergence, and alleviates the need for labor-intensive bench work. Illustratively, the embodiments herein may be used to calculate circuit components as well as frequency domain responses for multiplexed filters, common in RF and microwave communication systems. For instance, the novel techniques calculate frequency offsets of "input resonators," and use only a few frequency points to achieve the desired result. That is, the techniques have the ability to go from lowpass prototypes of each of the multiplexer's respective filters to a multiplexer design that is flexible enough to handle arbitrary filter bandwidths, number of filters, filter orders, and filter responses.

Figure 35:
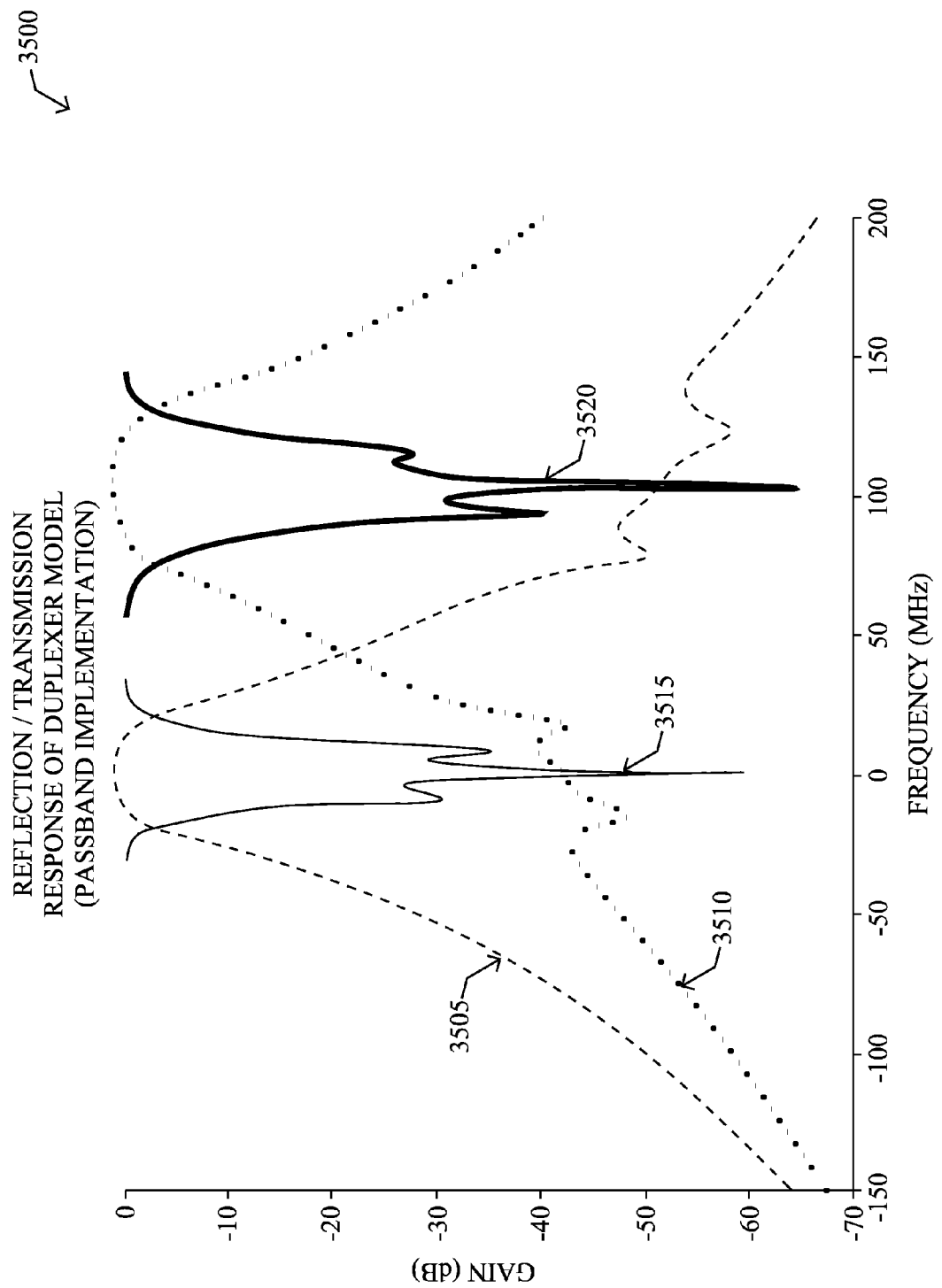
FIG. 35 illustrates the analysis results for a passband implementation of a duplexer in accordance with one or more embodiments described herein.

For example, FIG. 35 illustrates the analysis results for a passband implementation of a duplexer. In particular, the graph 3500 in FIG. 35 represents a reflection/transmission response of the duplexer model as achieved through the invention described herein, where the dashed and dotted curves 3505 and 3510 represent the transmission response for separate receive and transmit filters respectively. Correspondingly, the solid and double solid curves 3515 and 3520 represent the reflection response calculated at the output ports of each of the respective receive and transmit filters. In other words, FIG. 35 represents a calculated result of taking the resulting multiplexer parameters (admittance matrix), implementing it in a passband format, and simulating it on a software platform (e.g., a simulation program).

Figure 36:
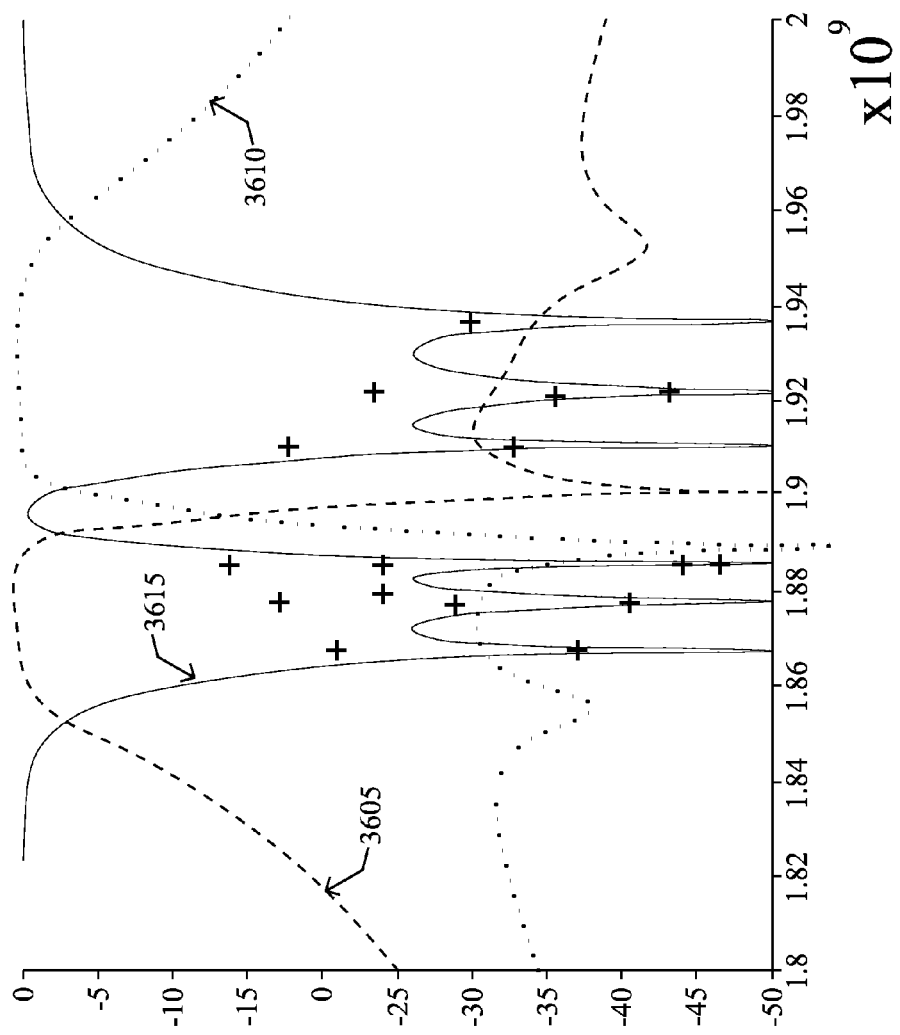
FIG. 36 illustrates the response of two asymmetric filters duplexed at a common junction in accordance with one or more embodiments described herein.

FIG. 36 illustrates the response of two asymmetric filters duplexed at a common junction. That is, in FIG. 36, the graph 3600 represents the analysis results of a duplexer, illustrating a calculation of the S-parameters from the multiplexer parameters (admittance matrix), particularly where the passband response is realized using a lowpass-to-bandpass transformation. Note that the two asymmetric filters may have complex implementations, and hence corresponding mathematical descriptions. Each of the resonant circuits within the filters couple energy between one another, and the algorithm herein produces the desired result regardless of the filter complexity. The dashed and dotted curves 3605 and 3610 again represent the transmission response for each of the respective duplexer filters. The solid curve 3615 represents the reflection response at the duplexing junction (a single calculated reflection response) as achieved through the invention described herein. Note that the '+'s represent the reflection response of the duplexer at each of the respective is match frequencies after each iteration, thus demonstrating the convergence of the algorithm described above.

Figure 37:
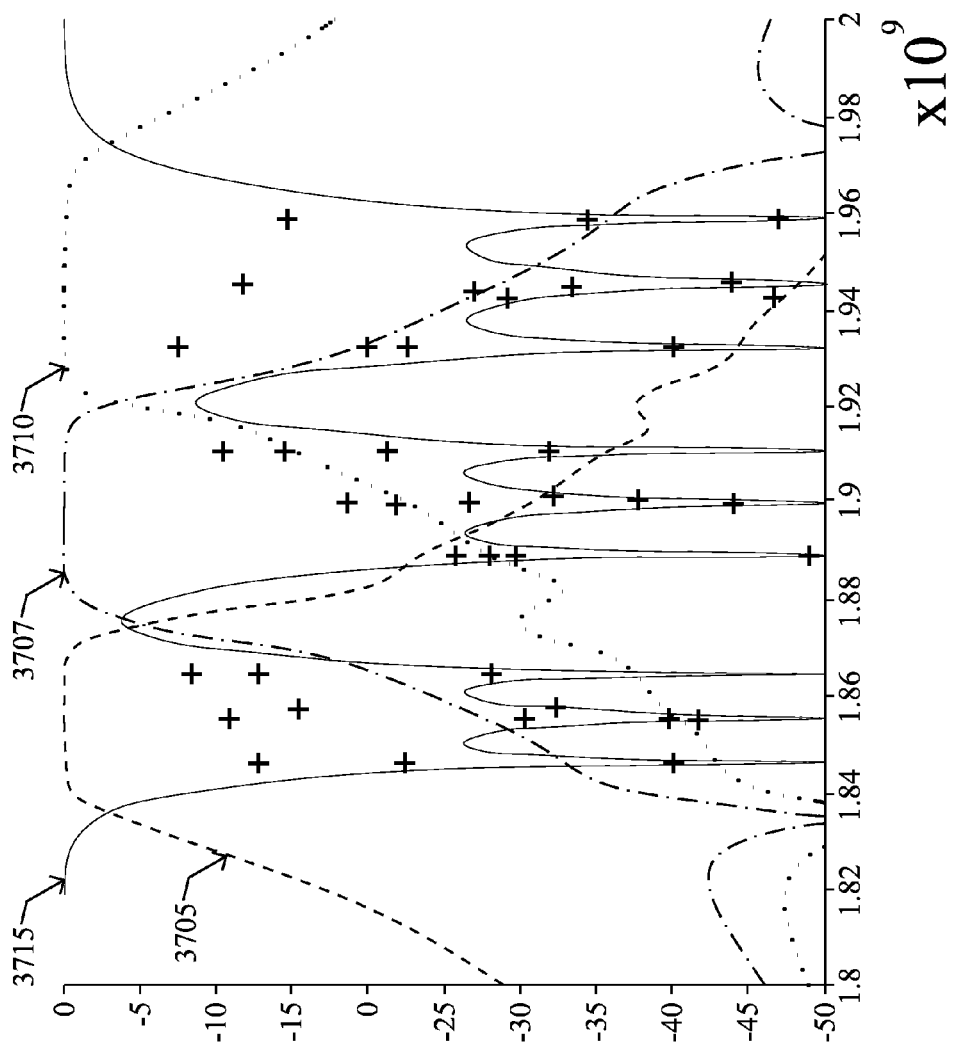
FIG. 37 illustrates the response of three filters triplexed at a common junction in accordance with one or more embodiments described herein.

Further, FIG. 37 illustrates the response of three filters triplexed at a common junction, i.e., graph 3700 represents the analysis results of a triplexer. The dashed, dash/dotted, and dotted curves 3705, 3707, and 3710 represent the transmission response for each of the respective triplexer filters. According to the inventive technique described above, the solid curve 3715 represents the reflection response at the triplexing junction, again with the '+'s representing the reflection response of the triplexer at each of the respective match frequencies after each iteration thus demonstrating the convergence of the algorithm. Additional numbers of filters may also utilize the techniques described above to achieve similar advantageous results to model the multiplexers at the common junction, and the duplexer and triplexer are merely example multiplexers herein.

While there have been shown and described illustrative embodiments that model passive multiplexers for signal filters, it is to be understood that various other adaptations and modifications may be made within the spirit and scope of the embodiments herein. For example, the embodiments have been shown and described herein with specific mathematical representations and equations. However, the embodiments in their broader sense are not so limited, and may, in fact, be used with any insignificant variation. For example, various values may be adjusted (e.g., offsets, frequency shifts, being equal to values other than zero, etc.), an order of steps may be rearranged (e.g., any steps or groups of steps not dependent on previous steps may be performed in any order), and parameter types may also be changed (e.g., using R, L, and C values in place of g-values and m-values, etc.). In addition, as noted above, optimization algorithms other than the one specifically illustrated may also be employed to converge on an admittance matrix for the modeled passive multiplexer.

Moreover, it should be noted that the term "block diagram," as used herein, also refers to other graphical modeling formalisms. For instance, flow-charts are block diagrams of entities that are connected by relations. Flow-charts are used to capture process flow and are not generally suitable for describing dynamic system behavior. Data flow block diagrams are diagrams of entities with relations between them that describe a graphical programming paradigm where the availability of data is used to initiate the execution of blocks, where a block represents an operation and a line represents execution dependency describing the direction of data flowing between blocks. It will be appreciated that a block diagram model may include entities that are based on other modeling domains within the block diagram. A common characteristic among these various forms of block diagrams is that they define semantics on how to execute them.

In graphical modeling environments, such as model-based design tools, block diagram models can be created to represent a design, or algorithm, of an implementation for a computational hardware. One or more block diagram models may represent a design for a target hardware platform. A target hardware platform used in this application may include a single computing platform or multiple computing platforms. A target hardware platform may also have other elements such as memory, interfaces, or other integrated circuits (ICs). An automatic code generation application can automatically generate code and build programs from the block diagram model for implementation on the target hardware platform based on the design specified by the model. In this manner, the design of a block diagram model behaves as an implementation specification for automatic code generation. A graphical block diagram modeling environment can be used to produce designs and algorithms that can be implemented on a processor or computational IC, such as an FPGA or ASIC.

The foregoing description has been directed to specific embodiments of the present invention. It will be apparent, however, that other variations and modifications may be made to the described embodiments, with the attainment of some or all of their advantages. For instance, it is expressly contemplated that the components and/or elements described herein can be implemented as software being stored on a tangible, non-transitory, computer-readable medium (e.g., disks/CDs/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the invention.

What is claimed is:

1. A computer-implemented method for use with modeling a passive multiplexer, the method comprising:
obtaining parameters for individual signal filters of a plurality of signal filters of the passive multiplexer, the plurality of signal filters joined at a common junction;
calculating an initial resonant frequency offset vector estimation, where the calculating is:
performed through iterative reduction for iterative combinations of resonant circuits connected at the common junction and appropriately terminated,
performed at a normalized frequency offset for the iterative combinations, and
based on the filter parameters of the iterative combinations;
calculating an initial match frequency vector based on the parameters such that the input reflection coefficient vector substantially equals zero;
calculating an initial input impedance vector from the initial match frequency vector, the calculating an initial input impedance vector based on:
an initial resonant frequency offset vector estimation at the common junction, and
the parameters;
iteratively recalculating an updated input impedance vector for an updated match frequency vector, where:
the updated match frequency vector is based on updated resonant frequency offset vectors, and
the updated resonant frequency offset vectors are based on a difference between a present input impedance vector and an ideal input impedance vector while the input reflection coefficient vector for the multiplexer substantially equals zero; and converging on a set of multiplexer parameters for the passive multiplexer using the iteratively recalculating.

2. The method as in claim 1, further comprising:
generating a software-based simulation user interface block according to the multiplexer parameters for the modeled passive multiplexer.

3. The method as in claim 1, wherein the parameters comprise susceptances and coupling parameters generated from a lowpass prototype of the corresponding filter.

4. The method as in claim 1, wherein the parameters comprise g-values and m-values.

5. The method as in claim 1, wherein the iterative reduction comprises:
establishing the normalized frequency offset from 0 hertz (Hz) for each filter;
selecting a combination of filters that have approximately the same normalized frequency offset;
terminating resonators of the selected filters in a load that is substantially equal to a characteristic impedance of the selected filters; and
calculating the resonant frequency offset vector estimation such that the input reflection coefficient vector at the common junction is substantially zero at the center frequencies of each of the respective selected filters.

6. The method as in claim 5, further comprising:
repeating the iterative reduction for each additional filter combination.

7. The method as in claim 1, wherein the iterative reduction utilizes pairs of resonant circuits as the combinations of resonant circuits.

8. The method as in claim 1, wherein calculating the resonant frequency offset vector estimation comprises:
utilizing a frequency-invariant susceptance.

9. The method as in claim 1, further comprising:
representing within the multiplexer parameters:
m-values that differ from the m-values of the filters,
c-values that are the same as the c-values for the filters, and
final updated resonant frequency offset vectors.

10. The method as in claim 1, further comprising:
representing the multiplexer parameters as an admittance matrix.

11. The method as in claim 1, wherein converging comprises:
calculating correction values for selected parameters to minimize the difference between the present input impedance vector and the ideal input impedance vector.

12. The method as in claim 1, wherein converging comprises:
calculating the updated match frequency vector based on results obtained from calculating a coarse frequency response of the multiplexer using the parameters.

13. The method as in claim 12, wherein calculating the updated match frequency vector comprises:
calculating, between each reflection zero frequency, a local maxima of the input reflection coefficient vector; and
calculating a correction of the inner reflection zero frequencies based on a parabolic approximation.

14. The method as in claim 1, further comprising:
iteratively recalculating until either a maximum number of iterations is reached or some threshold difference is obtained between the present input impedance vector and the ideal input impedance vector.

15. The method as in claim 1, wherein calculating the initial match frequency vector comprises:
calculating the initial match frequency vector based on the parameters and differing bandwidths of the filters such that the input reflection coefficient vector substantially equals zero.

16. The method as in claim 1, wherein the filters are selected from a group consisting of: transmission filters, reception filters, radio frequency (RF) filters, and microwave filters.

17. A computer-implemented method for use with modeling a passive multiplexer, the method comprising:
obtaining filter parameters for individual signal filters of a plurality of signal filters of the passive multiplexer joined at a common junction;
calculating an initial resonant frequency offset vector estimation based on the filter parameters;
inputting the initial resonant frequency offset vector estimation into a convergence algorithm to determine a set of multiplexer parameters, the convergence algorithm different from the initial resonant frequency offset vector estimation calculation; and
converging on the set of multiplexer parameters based on the convergence algorithm.

18. The method as in claim 17, wherein calculating the initial resonant frequency offset vector estimation is performed through iterative reduction for iterative combinations of resonant circuits connected at the common junction and appropriately terminated, and performed at a normalized frequency offset for the iterative combinations.

19. The method as in claim 18, wherein the iterative reduction comprises:
establishing the normalized frequency offset from 0 hertz (Hz) for each filter;
selecting a combination of filters that have approximately the same normalized frequency offset;
terminating resonators of the selected filters in a load that is substantially equal to a characteristic impedance of the selected filters; and
calculating the resonant frequency offset vector estimation such that an input reflection coefficient vector at the common junction is substantially zero at the center frequencies of each of the respective selected filters.

20. The method as in claim 18, wherein the iterative reduction utilizes pairs of resonant circuits as the combinations of resonant circuits.

21. The method as in claim 17, wherein the convergence algorithm comprises:
calculating an initial match frequency vector based on the parameters such that an input reflection coefficient vector substantially equals zero;
calculating an initial input impedance vector from the initial match frequency vector based on the initial resonant frequency offset vector estimation and the parameters;
iteratively recalculating an updated input impedance vector for an updated match frequency vector, where:
the updated match frequency vector is based on updated resonant frequency offset vectors, and
the updated resonant frequency offsets are based on a difference between a present input impedance vector and an ideal input impedance vector where the input reflection coefficient vector for the multiplexer substantially equals zero; and
is converging on the set of multiplexer parameters using the recalculating.

22. The method as in claim 21, wherein calculating the initial match frequency vector comprises:
calculating the initial match frequency vector based on the parameters and differing bandwidths of the filters such that the input reflection coefficient vector substantially equals zero.

23. The method as in claim 21, wherein converging comprises:
calculating correction values for selected parameters to minimize the difference between the present input impedance vector and the ideal input impedance vector.

24. The method as in claim 21, wherein converging comprises:
calculating the updated match frequency vector based on results obtained from calculating a coarse frequency response of the multiplexer using the parameters, by:
calculating, between each reflection zero frequency, a local maxima of the input reflection coefficient vector; and
calculating a correction of the inner reflection zero frequencies based on a parabolic approximation.

25. The method as in claim 21, further comprising:
iteratively recalculating until either a maximum number of iterations is reached or some threshold difference is obtained between the present input impedance vector and the ideal input impedance vector.

26. The method as in claim 17, further comprising:
generating a software-based simulation user interface block according to the multiplexer parameters for the modeled passive multiplexer.

27. A computer-implemented method for use with modeling a passive multiplexer, the method comprising:
obtaining filter parameters for individual signal filters of a plurality of signal filters of the passive multiplexer joined at a common junction;
calculating an initial resonant frequency offset vector estimation, where the calculating is:
performed through iterative reduction for iterative combinations of resonant circuits connected at the common junction and appropriately terminated,
performed at a normalized frequency offset for the iterative combinations, and
based on the filter parameters of the iterative combinations; and
providing the initial resonant frequency offset vector estimation to a convergence algorithm configured to determine a set of multiplexer parameters, the convergence algorithm different from the initial resonant frequency offset vector estimation calculation.

28. The method as in claim 27, wherein the iterative reduction comprises:
establishing the normalized frequency offset from 0 hertz (Hz) for each filter;
selecting a combination of filters that have approximately the same normalized frequency offset;
terminating resonators of the selected filters in a load that is substantially equal to a characteristic impedance of the selected filters; and
calculating the resonant frequency offset vector estimation such that an input reflection coefficient vector at the common junction is substantially zero at the center frequencies of each of the respective selected filters.

29. The method as in claim 28, further comprising:
repeating the iterative reduction for each additional filter combination.

30. The method as in claim 27, wherein the iterative reduction utilizes pairs of resonant circuits as the combinations of resonant circuits.

31. The method as in claim 27, wherein calculating the resonant frequency offset vector estimation comprises:
utilizing a frequency-invariant susceptance.

32. A tangible, non-transitory computer-readable medium comprising program instructions for use with modeling a passive multiplexer, the program instructions when executed by a processor operable to:
obtain parameters for individual signal filters of a plurality of signal filters of the passive multiplexer, the plurality of signal filters joined at a common junction;
calculate an initial resonant frequency offset vector estimation, where the calculating is:
performed through iterative reduction for iterative combinations of resonant circuits connected at the common junction and appropriately terminated,
performed at a normalized frequency offset for the iterative combinations, and
based on the filter parameters of the iterative combinations;
calculate an initial match frequency vector based on the parameters such that an input reflection coefficient vector at the common junction substantially equals zero;
calculate an initial input impedance vector from the initial match frequency vector, the calculate an initial input impedance vector based on:
the initial resonant frequency offset vector estimation, and
the parameters;
iteratively recalculate an updated input impedance vector for an updated match frequency vector, where:
the updated match frequency vector is based on updated resonant frequency offset vectors, and
the updated resonant frequency offsets are based on a difference between a present input impedance vector and an ideal input impedance vector where the input reflection coefficient vector for the multiplexer substantially equals zero; and
converge on a set of multiplexer parameters using the recalculating.

33. The computer-readable medium as in claim 32, wherein the program is embodied as a software-based simulation user interface block.

34. The computer-readable medium as in claim 32, wherein the program instructions, when executed, are further operable to iterative reduce though:
establishment of the normalized frequency offset from 0 hertz (Hz) for each filter;
selection of a combination of filters that have approximately the same normalized frequency offset;
termination of resonators of the selected filters in a load that is substantially equal to a characteristic impedance of the selected filters; and
calculation of the resonant frequency offset vector estimation such that the input reflection coefficient vector at the common junction is substantially zero at the center frequencies of each of the respective selected filters.

35. The computer-readable medium as in claim 34, wherein the program instructions, when executed, are further operable to:
repeat the iterative reduction for each additional filter combination.

36. The computer-readable medium as in claim 32, wherein the program instructions, when executed, are further operable to converge though:

calculation of correction values for selected parameters to minimize the difference between the present input impedance vector and the ideal input impedance vector.

37. The computer-readable medium as in claim 32, wherein the program instructions, when executed, are further operable to converge though:
calculation of the updated match frequency vector based on results obtained from calculating a coarse frequency response of the multiplexer using the parameters.

38. The computer-readable medium as in claim 37, wherein the program instructions, when executed, are further operable to calculate the updated match frequency vector though:
calculation, between each reflection zero frequency, of a local maxima of the input reflection coefficient vector; and
calculation of a correction of the inner reflection zero frequencies based on a parabolic approximation.

39. The computer-readable medium as in claim 32, wherein the program instructions, when executed, are further operable to:
iteratively recalculate until either a maximum number of iterations is reached or some threshold difference is obtained between the present input impedance vector and the ideal input impedance vector.

40. A tangible, non-transitory computer-readable medium comprising program instructions for use with modeling a passive multiplexer, the program instructions when executed by a processor operable to:
obtain filter parameters for individual signal filters of a plurality of signal filters of the passive multiplexer joined at a common junction;
calculate an initial resonant frequency offset vector estimation based on the filter parameters;
input the initial resonant frequency offset vector estimation into a convergence algorithm to determine a set of multiplexer parameters, the convergence algorithm different from the initial resonant frequency offset vector estimation calculation; and
converge on the set of multiplexer parameters based on the convergence algorithm.

41. The computer-readable medium as in claim 40, wherein the program is embodied as a software-based simulation user interface block.

42. The computer-readable medium as in claim 40, wherein calculating the initial resonant frequency offset vector estimation is performed through iterative reduction for iterative combinations of resonant circuits connected at the common junction and appropriately terminated, and performed at a normalized frequency offset for the iterative combinations.

43. A tangible, non-transitory computer-readable medium comprising program instructions for use with modeling a passive multiplexer, the program instructions when executed by a processor operable to:
obtain filter parameters for individual signal filters of a plurality of signal filters of the passive multiplexer joined at a common junction;
calculate an initial resonant frequency offset vector estimation, where the calculating is:
performed through iterative reduction for iterative combinations of resonant circuits connected at the common junction and appropriately terminated,
performed at a normalized frequency offset for the iterative combinations, and
based on the filter parameters of the iterative combinations; and
provide the initial resonant frequency offset vector estimation to a convergence algorithm configured to determine a set of multiplexer parameters, the convergence algorithm different from the initial resonant frequency offset vector estimation calculation.

44. The computer-readable medium as in claim 43, wherein the program is embodied as a software-based simulation user interface block.

* * * * *

UNITED STATES PATENT AND TRADEMARK OFFICE
CERTIFICATE OF CORRECTION

PATENT NO. : 8,676,550 B1
APPLICATION NO. : 12/896064
DATED : March 18, 2014
INVENTOR(S) : Timothy Reeves It is certified that error appears in the above-identified patent and that said Letters Patent is hereby corrected as shown below:

In the Claims:
Claim 21, col. 16, line 66 should read:
~~is converging on the set of multiplexer parameters using the~~
converging on the set of multiplexer parameters using the Signed and Sealed this
Seventeenth Day of June, 2014

Michelle K. Lee
*Deputy Director of the United States Patent and Trademark Office*